(12) United States Patent
Xing

(10) Patent No.: US 12,087,747 B2
(45) Date of Patent: Sep. 10, 2024

(54) DISPLAY PANEL AND FABRICATION METHOD THEREOF, AND DISPLAY DEVICE

(71) Applicant: Xiamen Tianma Micro-Electronics Co.,Ltd., Xiamen (CN)

(72) Inventor: Liang Xing, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 718 days.

(21) Appl. No.: 17/159,777

(22) Filed: Jan. 27, 2021

(65) Prior Publication Data

US 2022/0173087 A1 Jun. 2, 2022

(30) Foreign Application Priority Data

Dec. 1, 2020 (CN) .......................... 202011386324.5

(51) Int. Cl.
| | |
|---|---|
| H01L 29/18 | (2006.01) |
| H01L 25/16 | (2023.01) |
| H01L 33/00 | (2010.01) |
| H01L 33/62 | (2010.01) |

(52) U.S. Cl.
CPC ............ H01L 25/167 (2013.01); H01L 33/62 (2013.01)

(58) Field of Classification Search
CPC ... H01L 25/167; H01L 33/62; H01L 25/0753; H05B 45/325; H05B 45/00
See application file for complete search history.

(56) References Cited

U.S. PATENT DOCUMENTS

| | | | |
|---|---|---|---|
| 10,777,718 B2 * | 9/2020 | Yu .......................... | H01L 27/156 |
| 2015/0131020 A1 * | 5/2015 | Chang ............... | H01L 29/78693 |
| | | | 257/43 |
| 2015/0312977 A1 * | 10/2015 | Jong ...................... | H05B 45/44 |
| | | | 315/186 |
| 2018/0197471 A1 * | 7/2018 | Rotzoll ................ | G09G 3/2003 |
| 2019/0267363 A1 | 8/2019 | Bower et al. | |
| 2020/0119243 A1 * | 4/2020 | Yu .......................... | H01L 25/167 |
| 2021/0166620 A1 * | 6/2021 | Kim ........................ | G09G 3/035 |
| 2021/0183833 A1 * | 6/2021 | Hu .......................... | H01L 33/62 |
| 2021/0257348 A1 * | 8/2021 | Low ..................... | H01L 25/0753 |
| 2023/0028746 A1 * | 1/2023 | Yang ........................ | G09G 3/32 |
| 2023/0107672 A1 * | 4/2023 | Hua .................... | H01L 25/0753 |
| | | | 257/79 |

FOREIGN PATENT DOCUMENTS

| CN | 109768027 A | 5/2019 |
|---|---|---|
| CN | 111681598 A | 9/2020 |

* cited by examiner

Primary Examiner — Ismail A Muse
(74) Attorney, Agent, or Firm — Anova Law Group, PLLC

(57) ABSTRACT

A display panel and its fabrication method, and a display device are provided in the present disclosure. The display panel includes a substrate, including a display region; a light-emitting diode (LED) array at the display region, where the LED array includes a plurality of LED units arranged in an array; and a pulse-width modulation chip array at the display region, where the pulse-width modulation chip array includes a plurality of pulse-width modulation chips arranged in an array. The plurality of LED units is electrically connected to the plurality of pulse-width modulation chips in a one-to-one correspondence; and a pulse-width modulation chip of the plurality of pulse-width modulation chips is configured to adjust a light-emitting duration of a corresponding LED unit electrically connected thereto.

19 Claims, 24 Drawing Sheets

DISPLAY PANEL AND FABRICATION METHOD THEREOF, AND DISPLAY DEVICE

CROSS-REFERENCE TO RELATED APPLICATION

This application claims the priority of Chinese Patent Application No. 202011386324.5, filed on Dec. 1, 2020, the content of which is incorporated herein by reference in its entirety.

TECHNICAL FIELD

The present disclosure generally relates to the field of display technology and, more particularly, relates to a display panel and its fabrication method, and a display device.

BACKGROUND

With continuous development of light-emitting and display technologies, mainstream mini-light-emitting diode (LED) and micro-LED displays have gradually become the focus of various manufacturers due to their advantages of high brightness, high contrast, high resolution, high color saturation, and the like.

Display devices or light-emitting devices, including mini-LED and micro-LED displays, may include a large quantity of small-size light-emitting diode arrays. The driver IC for driving the light-emitting diodes to emit light may be arranged on the periphery of the display panel, and the light-emitting diodes may be electrically connected to the driver IC through wiring. As the wiring length increases, the light-emitting diodes farther from the driver IC may experience signal delay due to the impedance of the wiring itself. Therefore, the signals received by the light-emitting diodes at the far end and the near end of the driver IC may be different, which results in poor display brightness uniformity.

SUMMARY

One aspect of the present disclosure provides a display panel. The display panel includes a substrate, including a display region; a light-emitting diode (LED) array at the display region, where the LED array includes a plurality of LED units arranged in an array; and a pulse-width modulation chip array at the display region, where the pulse-width modulation chip array includes a plurality of pulse-width modulation chips arranged in an array. The plurality of LED units is electrically connected to the plurality of pulse-width modulation chips in a one-to-one correspondence; and a pulse-width modulation chip of the plurality of pulse-width modulation chips is configured to adjust a light-emitting duration of a corresponding LED unit electrically connected thereto.

Another aspect of the present disclosure provides a display device including a display panel. The display panel includes a substrate, including a display region; a light-emitting diode (LED) array at the display region, where the LED array includes a plurality of LED units arranged in an array; and a pulse-width modulation chip array at the display region, where the pulse-width modulation chip array includes a plurality of pulse-width modulation chips arranged in an array. The plurality of LED units is electrically connected to the plurality of pulse-width modulation chips in a one-to-one correspondence; and a pulse-width modulation chip of the plurality of pulse-width modulation chips is configured to adjust a light-emitting duration of a corresponding LED unit electrically connected thereto.

Another aspect of the present disclosure provides a method for fabricating a display panel. The method includes providing a substrate, which includes a display region, and disposing an LED array and a pulse-width modulation chip array at the display region of the substrate. The LED array includes a plurality of LED units arranged in an array; the pulse-width modulation chip array includes a plurality of pulse-width modulation chips arranged in an array; the plurality of the LED units is electrically connected to the plurality of the pulse-width modulation chips in a one-to-one correspondence; and the plurality of pulse-width modulation chips is configured to adjust light-emitting durations of the plurality of LED units electrically connected to the plurality of pulse-width modulation chips.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

DETAILED DESCRIPTION

The present disclosure is further described in detail below in conjunction with the drawings and embodiments. It can be understood that the specific embodiments described here are only used to explain the present disclosure, but not to limit the present disclosure. Furthermore, it should be noted that the drawings only show a part of the structure related to the present disclosure instead of all of the structure for ease of description.

The embodiments of the present provide a display panel. The display panel may include a substrate, including a display region. The display panel may further include an LED (light-emitting diode) array in the display region; and the LED array may include a plurality of LED units arranged in an array. The display panel may further include a pulse-width modulation chip array in the display region; and the pulse-width modulation chip array may include a plurality of pulse-width modulation chips arranged in an array. The plurality of LED units may be electrically connected to the plurality of pulse-width modulation chips in a one-to-one correspondence; and the plurality of pulse-width modulation chips may be configured to adjust the light-emitting durations of the LED units electrically connected to the plurality of pulse-width modulation chips.

By using the above-mentioned technical solution, the plurality of pulse-width modulation chips may be configured to be electrically connected to the plurality of LED units in a one-to-one correspondence at the display region, and the plurality of pulse-width modulation chips may be configured to adjust the light-emitting durations of the LED units electrically connected to the plurality of pulse-width modulation chips, thereby controlling the display grayscales of the LED units. In such way, the distance between the pulse-width modulation chip and the LED unit electrically connected to the pulse-width modulation chip may be relative short to reduce signal delay; moreover, the distances between different pulse-width modulation chips and the corresponding LED units may be same or equivalent, thereby reducing the signal differences of the LED units at different positions and improving the brightness uniformity of the display panel.

The above description may be the core idea of the present disclosure. The technical solutions in the embodiments of the present disclosure may be described clearly and completely in conjunction with the accompanying drawings in the embodiments of the present disclosure. Based on the embodiments of the present disclosure, all other embodiments obtained by those skilled in the art without creative work shall fall within the protection scope of the present disclosure.

Figure 1:
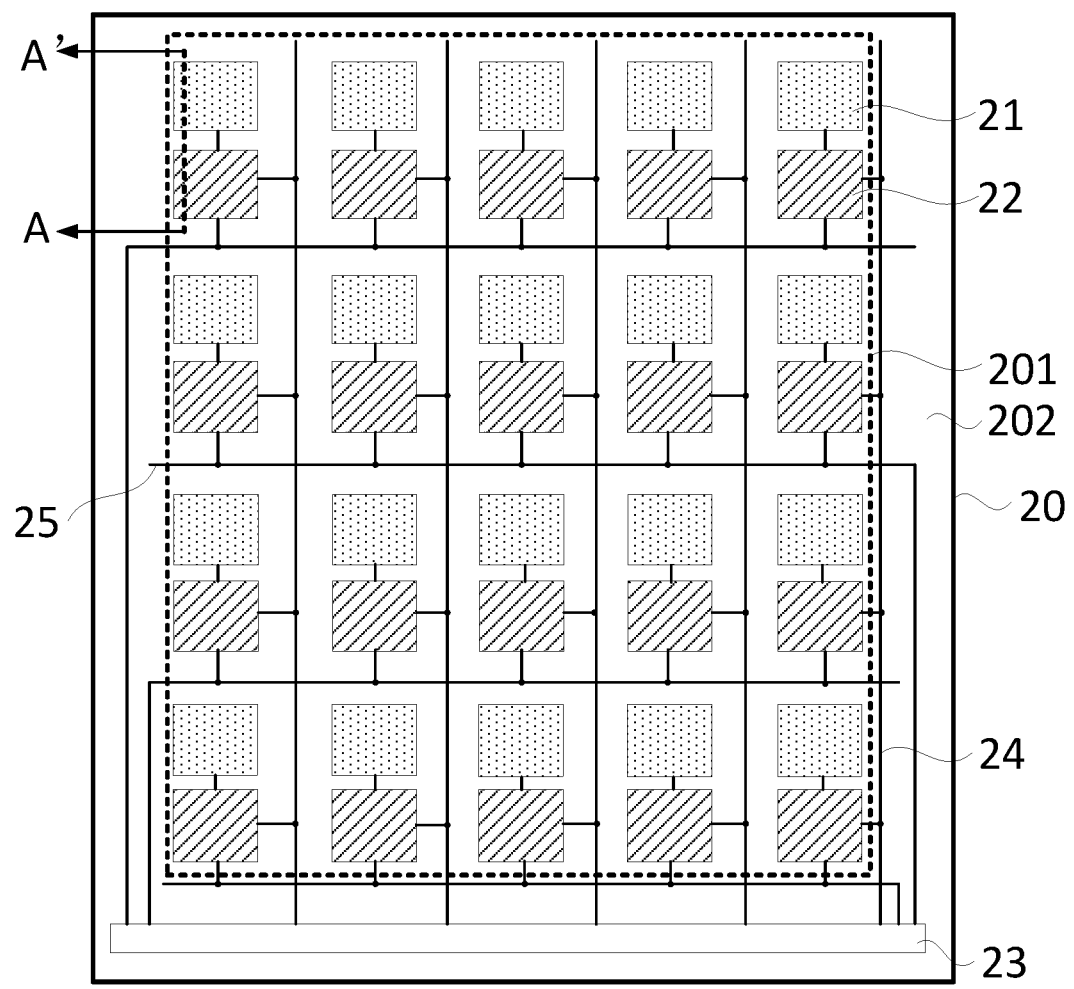
FIG. 1 illustrates a structural schematic of a display panel according to various embodiments of the present disclosure.
Figure 2:
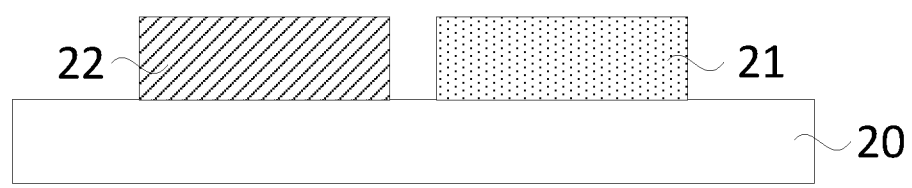
FIG. 2 illustrates a cross-sectional structural schematic along a A-A' direction in FIG. 1.

FIG. 1 illustrates a structural schematic of a display panel according to various embodiments of the present disclosure; and FIG. 2 illustrates a cross-sectional structural schematic along a A-A' direction in FIG. 2. As shown in FIGS. 1-2, the display panel provided by the embodiments of the present disclosure may include a substrate 20 including a display region 201. The display panel may further include an LED array at the display region 201; and the LED array may include a plurality of LED units 21 arranged in an array. The display panel may further include a pulse-width modulation chip array at the display region 201; and the pulse-width modulation chip array may include a plurality of pulse-width modulation chips 22 arranged in an array. The plurality of LED units 21 may be electrically connected to the plurality of pulse-width modulation chips 22 in a one-to-one correspondence; and the plurality of pulse-width modulation chips 22 may be configured to adjust the light-emitting durations of the LED units 21 electrically connected to the plurality of pulse-width modulation chips.

LED units 21 may include inorganic light-emitting diodes; and the inorganic light-emitting diodes may include mini-LEDs and micro-LEDs. The Mini-LEDs refer to the LEDs whose sizes are about a few hundred micrometers (μm), and the micro-LEDs refer to the LEDs whose sizes are less than one hundred micrometers (μm). The Mini-LEDs and micro-LEDs may all have the advantages of high resolution, high brightness, excellent energy saving, fast response speed, high light output efficiency, long lifetime, and the like. In other embodiments, the LED unit 21, which can also be other LED type, may have a front-mounted chip structure, a flip-chip structure, or a vertical package structure, which may be configured by those skilled in the art according to actual needs and may not be limited according to the embodiments of the present disclosure.

Referring to FIGS. 1-2, each LED unit 21 may be connected to one pulse-width modulation chip 22 accordingly; and the pulse-width modulation chip 22 may be configured to adjust the light-emitting duration of the LED unit 21 electrically connected to the pulse-width modulation chip 22 and may further control the display grayscale of the LED unit 21 by adjusting the light-emitting duration of the LED unit 21. The LED unit 21 and the pulse-width modulation chip 22 may be disposed on a same or different side of the substrate 20.

Exemplarily, as shown in FIGS. 1-2, disposing the LED units 21 and the pulse-width modulation chips 22 on a same side of the substrate 20 may be taken as an example in the embodiments of the present disclosure; and the pulse-width modulation chips 22, disposed in the display region 201, may be arranged with the LED units 21 in a one-to-one correspondence. Compared with the existing technology by connecting a drive chip disposed in the non-display region to each LED unit in the display region, the distance between the pulse-width modulation chip 22 and the LED unit 21 electrically connected to the pulse-width modulation chip 22 may be relative short to reduce signal delay in the embodiments of the present disclosure; moreover, the distances between different pulse-width modulation chips 22 and the corresponding LED units 21 may be same or equivalent, thereby reducing the signal differences of the LED units 21 at different positions and improving the brightness uniformity of the display panel.

It should be noted that the display panel may independently adjust the light-emitting duration of the LED unit 21 to achieve different grayscale displays. In other embodiments, the pulse-width modulation chip 22 may adjust the light-emitting duration of the LED unit 21 electrically connected to the pulse-width modulation chip 22, and simultaneously adjust the drive current of the LED unit 21 to implement different grayscale displays, which may not be limited according to the embodiments of the present disclosure.

In the display panel provided by the embodiments of the present disclosure, the pulse-width modulation chips 22 and the LED units 21 may be connected in a one-to-one correspondence in the display region 21; and the display grayscales of the LED units 21 may be controlled by adjusting the light-emitting durations of the LED units 21 electrically connected to the pulse-width modulation chips 22. In such way, the distance between the pulse-width modulation chip 22 and the LED unit 21 electrically connected to the pulse-width modulation chip 22 may be relative short to reduce signal delay; moreover, the distances between different pulse-width modulation chips 22 and the corresponding LED units 21 may be same or equivalent, thereby reducing the signal differences of the LED units 21 at different positions and improving the brightness uniformity of the display panel.

Optionally, the current values of the drive currents of all LED units 21 may be same.

In the embodiments of the present disclosure, the LED unit may implement different grayscale displays by adjusting the light-emitting duration of the LED unit 21 or the drive current of the LED unit 21. Optionally, in the embodiments of the present disclosure, by setting the current value of the drive current of the LED unit 21 to be same, the LED unit may implement different grayscale displays by only adjusting the light-emitting duration of the LED unit 21.

For example, the luminous efficiency of the LED unit under different drive currents may be significantly different; the luminous efficiency of the LED unit may be relatively high when working at a large current; and the luminous efficiency of the LED unit may be relatively low when working at a low current. In such way, the drive current of the LED unit may be small in the low grayscale range, such that the luminous efficiency of the LED unit is significantly low in the low grayscale range, thereby affecting the stability of the display panel. Accordingly, in the embodiments of the present disclosure, the current value of the drive current of each LED unit 21 may be set to be same, and the display grayscale may be controlled by adjusting the light-emitting duration of the LED unit 21 which is different from controlling the display grayscale by controlling the drive current in the existing technology, such that the drive current flowing through the LED unit 21 may be always same. Furthermore, the high luminous efficiency characteristics of the LED unit 21 at high current may be fully utilized, such that the luminous efficiency of the LED unit 21 may be relatively high in any grayscale including the low grayscale range, thereby improving the luminous efficiency of the LED unit 21 and ensuring the stability of the display panel.

Referring to FIG. 1, optionally, the substrate 20 may further include a non-display region 202, and the display panel may further include a drive chip 23 located in the non-display region 202, a plurality of data lines 24, and a plurality of scan lines 25. The drive chip 23 may be configured to provide a scan signal to the pulse-width modulation chip 22 through the scan line 25, and to provide a data signal to the pulse-width modulation chip 22 through the data line 24.

For example, the substrate 20 may further include the non-display region 202 which is adjacent to the display region 201, and the non-display region 202 may be disposed with the drive chip 23. The drive chip 23 may be electrically connected to the pulse-width modulation chip 22 through the scan line 25 to provide the scan signal for the pulse-width modulation chip 22. The drive chip 23 may be electrically connected to the pulse-width modulation chip 22 through the data line 24 to provide the data signal for the pulse-width modulation chip 22. The data signal may correspond to the display grayscale. When the pulse-width modulation chip 22 receives the scan signal, the pulse-width modulation chip 22 may generate a corresponding pulse-width modulation (PWM) signal according to the data signal, thereby further controlling the light-emitting duration of the LED unit 21 to implement the corresponding grayscale display.

It should be noted that the scan signal and the data signal may be provided by one drive chip 23. As shown in FIG. 1, using one drive chip 23 to provide the scan signal and the data signal may reduce the space occupied by the drive chip 23, thereby increasing the screen-to-body ratio. In other embodiments, the scan signal and the data signal may also be provided by different drive chips 23. When at least two drive chips 23 are used, the drive chips 23 may all be arranged at a same side of the display region 201, or at different sides of the display region 201, which may not be limited according to the embodiments of the present disclosure.

Figure 3:
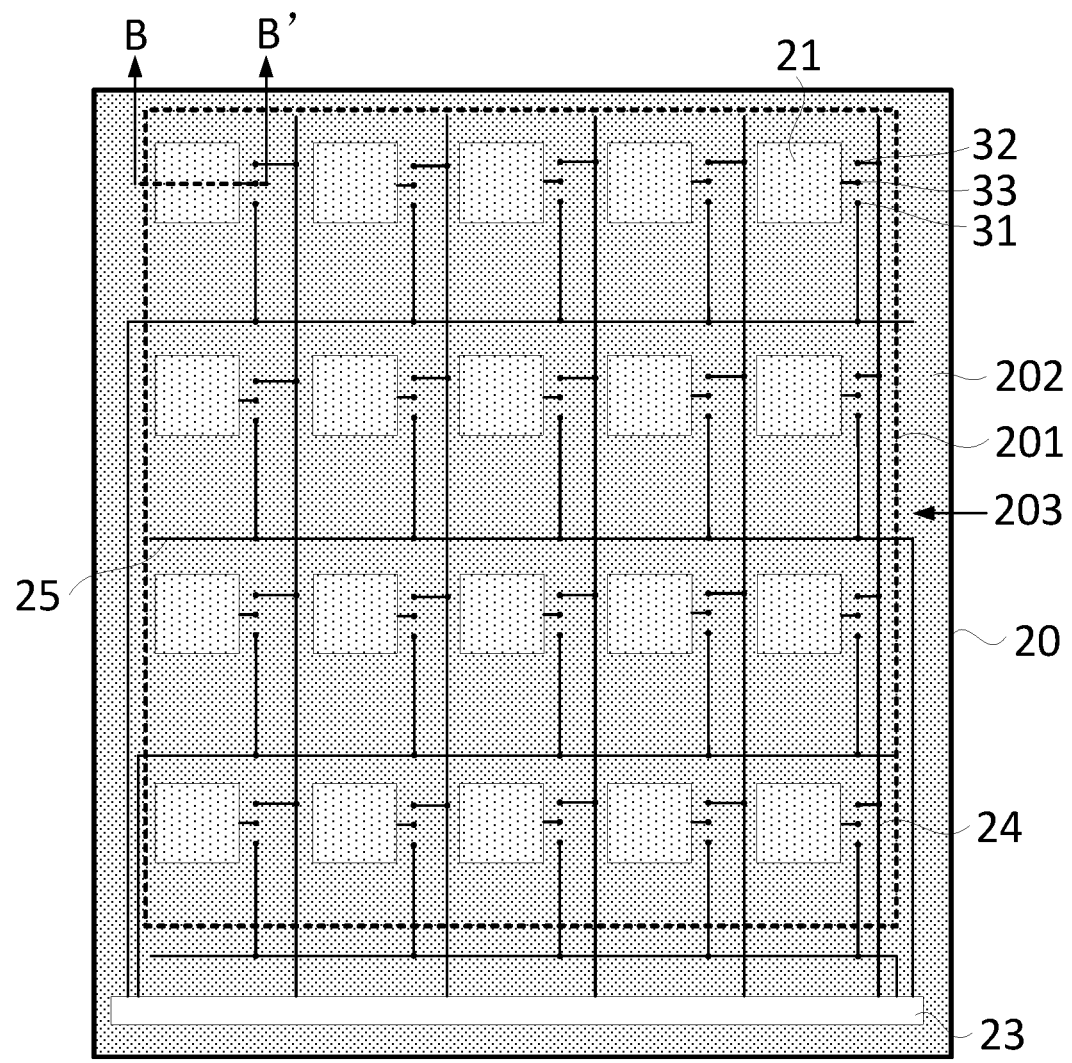
FIG. 3 illustrates a structural schematic of another display panel according to various embodiments of the present disclosure.
Figure 4:
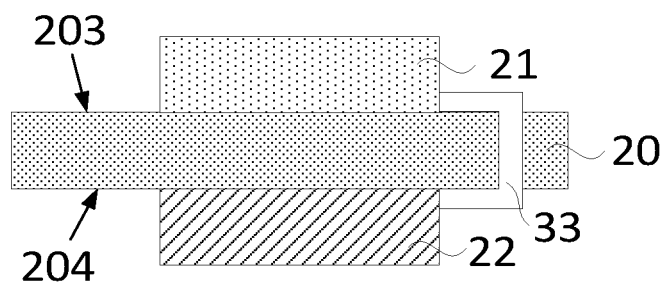
FIG. 4 illustrates a cross-sectional structural schematic along a B-B' direction in FIG. 3.

FIG. 3 illustrates a structural schematic of another display panel according to various embodiments of the present disclosure; and FIG. 4 illustrates a cross-sectional structural schematic along a B-B' direction in FIG. 3. As shown in FIGS. 3-4, optionally, the substrate 20 may include a first side 203 and a second side 204 which are opposite to each other. The LED array may be located on the first side 203, the pulse-width modulation chip array may be located on the second side 204, and the substrate 20 may be made of a transparent material.

The substrate 20 of the display panel provided by the embodiments of the present disclosure may be a transparent material, which may be applied to transparent display. As shown in FIGS. 3-4, the LED array and the pulse-width modulation chip array may be arranged at different sides of the substrate 20. Compared with that the LED array and the pulse-width modulation chip array are both located at the same side of the substrate 20, the arrangement of the LED array and the pulse-width modulation chip array at different sides of the substrate 20 may help to reduce the area of the substrate 20 shielded by the LED array and the pulse-width modulation chip array, thereby improving the transmittance of the display panel to implement transparent display.

Referring to FIGS. 3-4, optionally, along a direction perpendicular to the substrate 20, the LED units 21 and the pulse-width modulation chips 22, electrically connected in a one-to-one correspondence, may be overlapped with each other.

As shown in FIGS. 3-4, the LED units 21 and the pulse-width modulation chips 22, electrically connected in a one-to-one correspondence, may be overlapped with each other, which may further reduce the area of the substrate 20 shielded by the LED array and the pulse-width modulation chip array, thereby increasing the transmittance of the display panel and improving the transparent display effect.

Figure 5:
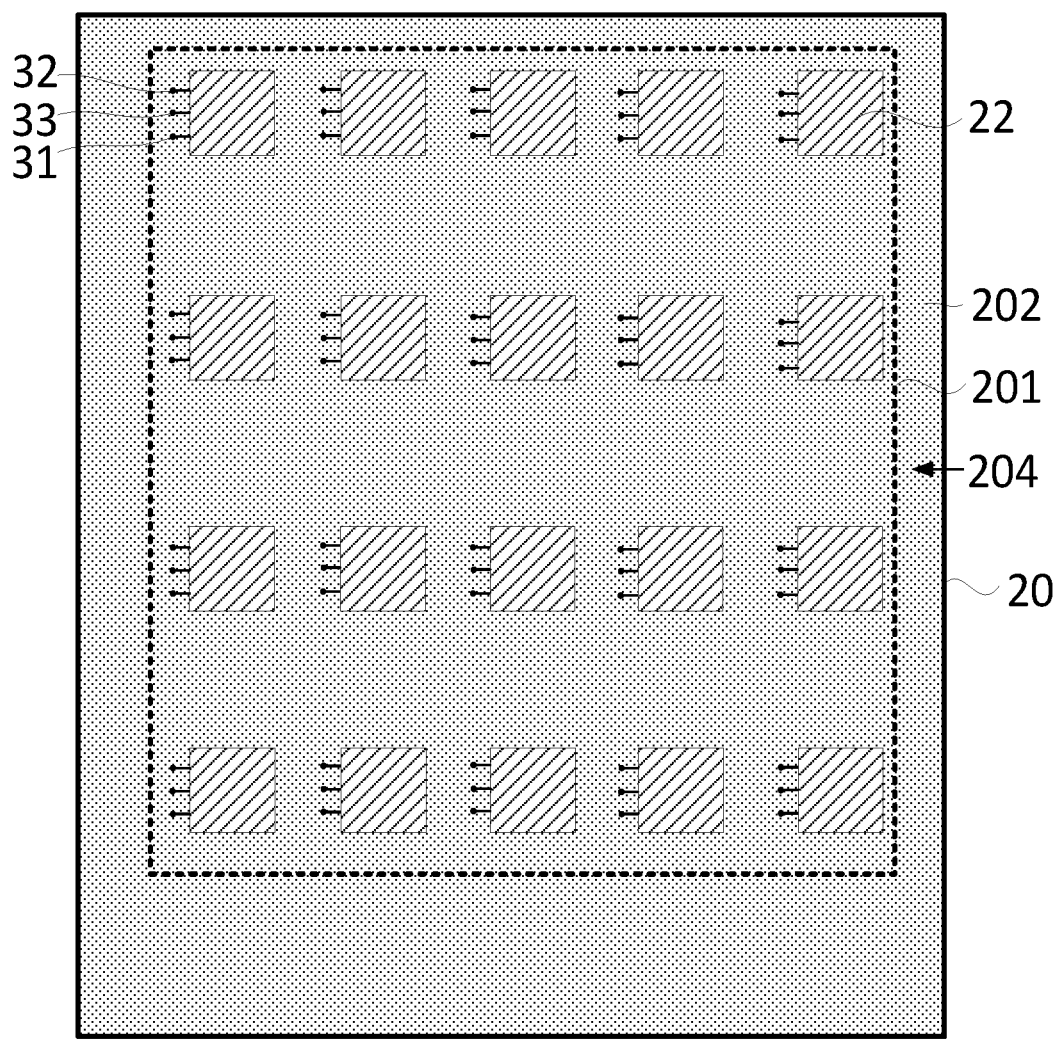
FIG. 5 illustrates a structural schematic of another display panel according to various embodiments of the present disclosure.

FIG. 5 illustrates a structural schematic of another display panel according to various embodiments of the present disclosure. As shown in FIGS. 3-5, optionally, the first side 203 of the substrate 20 may be disposed with a plurality of data lines 24 and a plurality of scan lines 25 which are insulated from each other; and the substrate 20 may be disposed with a plurality of first via holes 31, a plurality of second via holes 32, and a plurality of third via holes 33. The scan line 25 may be electrically connected to the pulse-width modulation chip 22 through the first via holes 31; the data line 24 may be electrically connected to the pulse-width modulation chip 22 through the second via holes 32; and the pulse-width modulation chip 22 may be electrically connected to the LED unit 21 through the third via holes 33.

When the LED array and the pulse-width modulation chip array are arranged at different sides of the substrate 20, the data lines 24 and the scan lines 25 may be arranged at a same side of the substrate 20 as the LED units 21. The plurality of first via holes 31, the plurality of second via holes 32, and the plurality of third via holes 33 may be disposed on the substrate 20 to implement the electrical connection between the pulse-width modulation chips 22 and each of the scan lines 25, the data lines 24 and the LED units 21.

For example, FIG. 3 illustrates a structural schematic of the first side 203 of the display panel, and FIG. 5 illustrates a structural schematic of the second side 204 of the display panel. As shown in FIG. 3 and FIG. 5, the LED array may be located on the first side 203, and the pulse-width modulation chip array may be located on the second side 204. The plurality of data lines 24 and the plurality of scan lines 25, which are insulated from each other, may be disposed at the first side 203 of the substrate 20. The scan line 25 may be electrically connected to the pulse-width modulation chip 22 through the first via hole 31 on the substrate 20, such that the scan line 25 may transmit the scan signal to the pulse-width modulation chip 22. The data line 24 may be electrically connected to the pulse-width modulation chip 22 through the second via hole 32 on the substrate 20, such that the data line 24 may transmit the data signal to the pulse-width modulation chip 22. The pulse-width modulation chip 22 may be electrically connected to the LED unit 21 through the third via hole 33 on the substrate 20, such that the pulse-width modulation chip 22 may adjust the light-emitting duration of the LED unit 21, thereby controlling the display grayscale of the LED unit 21.

Figure 6:
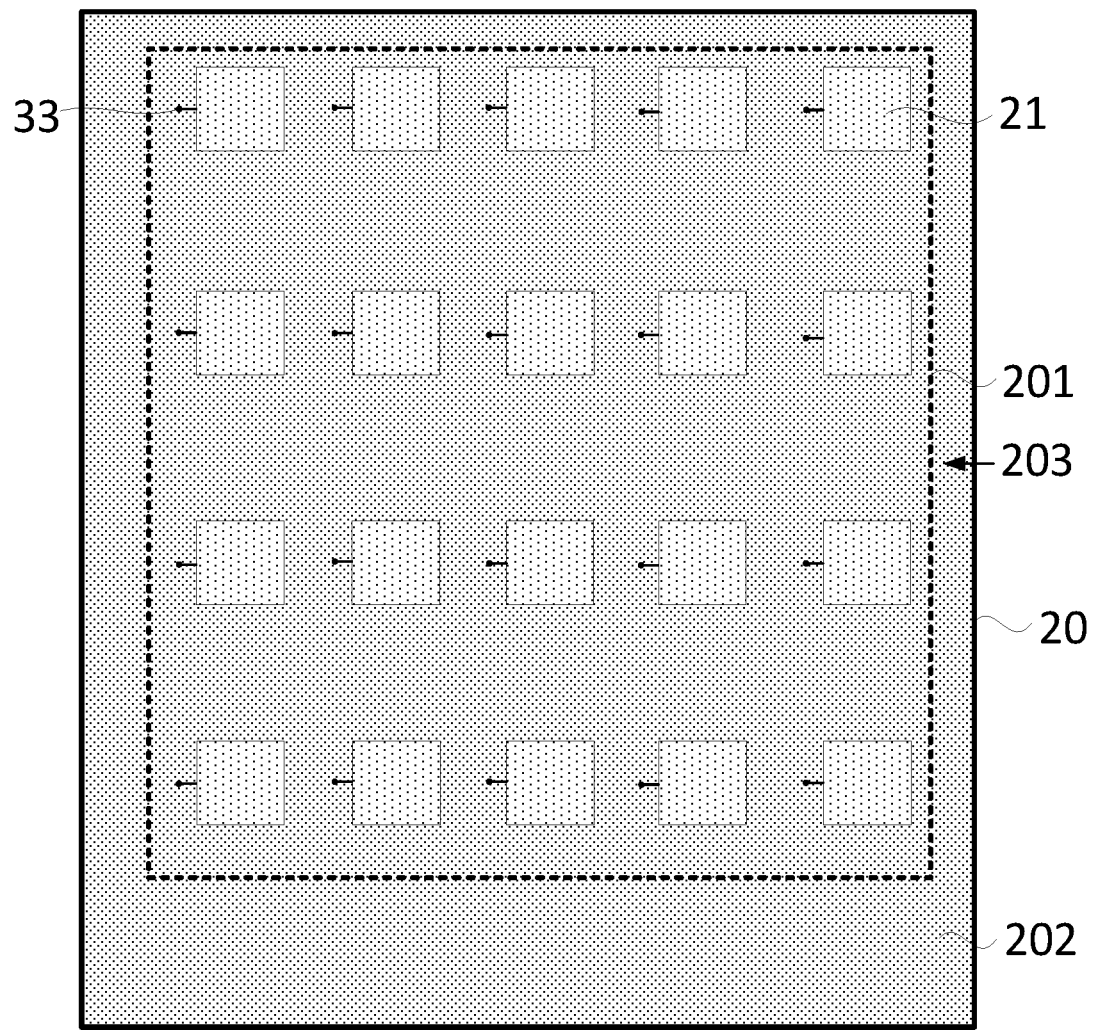
FIG. 6 illustrates a structural schematic of a first side of a display panel according to various embodiments of the present disclosure.
Figure 7:
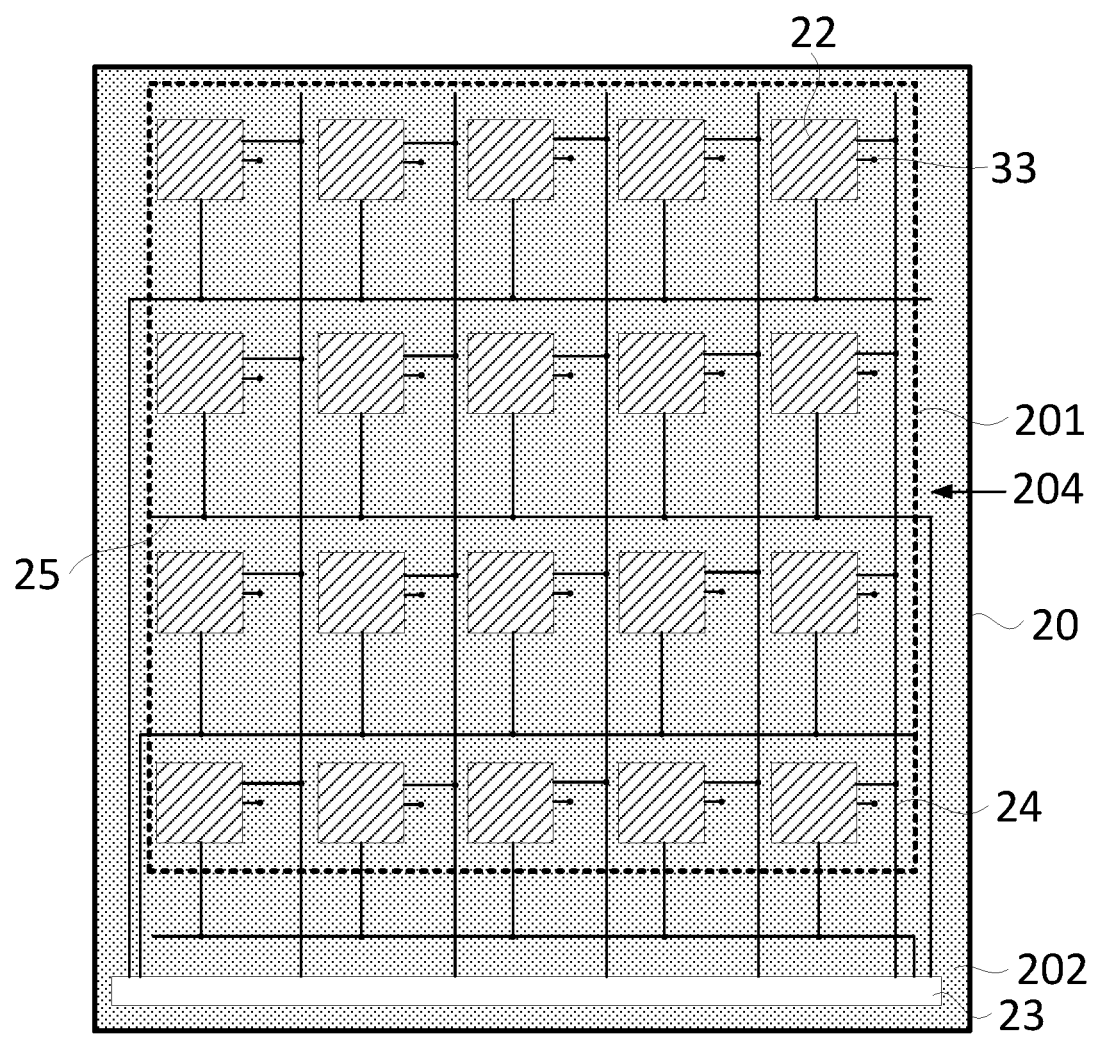
FIG. 7 illustrates a structural schematic of a second side of a display panel according to various embodiments of the present disclosure.

FIG. 6 illustrates a structural schematic of a first side of a display panel according to various embodiments of the present disclosure. FIG. 7 illustrates a structural schematic of a second side of a display panel according to various embodiments of the present disclosure. As shown in FIGS. 6-7, optionally, the plurality of data lines 24 and the plurality of scan lines 25 may be disposed at the second side 204 of the substrate 20; the data lines 24 and the scan lines 25 may be electrically connected to the pulse-width modulation chips 22 at the second side 204; the plurality of third via holes 33 may be disposed at the substrate 20; and the pulse-width modulation chips 22 may be electrically connected to the LED units 21 through the third via holes 33.

When the LED array and the pulse-width modulation chip array are disposed at different sides of the substrate 20, the data lines 24 and scan lines 25 may be disposed at a same side of the substrate 20 as the pulse-width modulation chips 22; and the electrical connections between the pulse-width modulation chips 22 and the LED units 21 may be achieved by disposing the plurality of third via holes 33 on the substrate 20.

For example, as shown in FIGS. 6-7, the LED array may be located at the first side 203, and the pulse-width modulation chip array may be located at the second side 204. The plurality of data lines 24 and the plurality of scan lines 25, which are insulated from each other, may be disposed at the second side 204 of the substrate 20. The scan line 25 may be electrically connected to the pulse-width modulation chip 22, such that the scan line 25 may transmit the scan signal to the pulse-width modulation chip 22. The data line 24 may be electrically connected to the pulse-width modulation chip 22, such that the data line 24 may transmit the data signal to the pulse-width modulation chip 22. The pulse-width modulation chip 22 may be electrically connected to the LED unit 21 through the third via hole 33 on the substrate 20, such that the pulse-width modulation chip 22 may adjust the light-emitting duration of the LED unit 21, thereby controlling the display grayscale of the LED unit 21. By arranging the data lines 24 and the scan lines 25 on a same side of the substrate 20 as the pulse-width modulation chips 22, the number of via holes on the substrate 20 may be reduced, which is beneficial for reducing the preparation process steps and the preparation cost.

Figure 8:
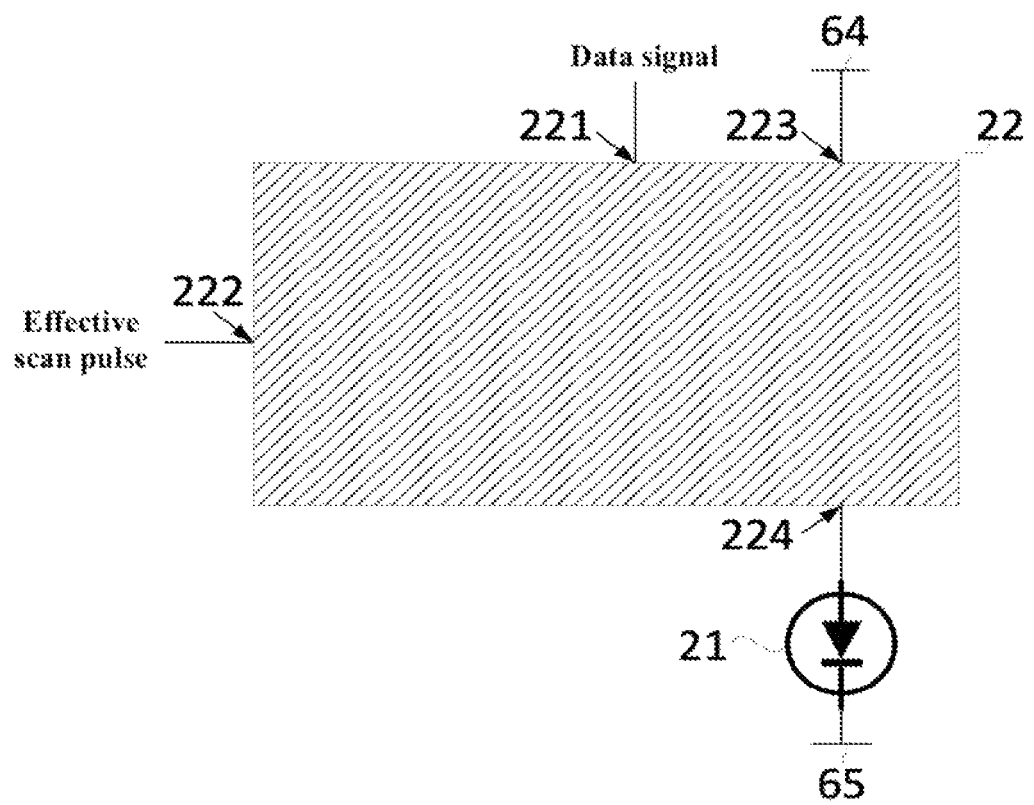
FIG. 8 illustrates a structural schematic of a pulse-width modulation chip according to various embodiments of the present disclosure.

FIG. 8 illustrates a structural schematic of a pulse-width modulation chip according to various embodiments of the present disclosure. As shown in FIG. 8, optionally, the pulse-width modulation chip 22 may include a data signal terminal 221, a scan signal terminal 222, a constant current power input terminal 223, and an output terminal 224. The output terminal 224 of the pulse-width modulation chip 22 may be electrically connected to the LED unit 21. The pulse-width modulation chip 22 may be configured to be activated when a valid scan pulse is inputted via the scan signal terminal 222 and to adjust the light-emitting duration of the LED unit 21 electrically connected to the pulse-width modulation chip 22 according to the data signal inputted via the data signal terminal 221.

For example, the data signal terminal 221 of the pulse-width modulation chip 22 may be configured to receive the data signal, the scan signal terminal 222 may be configured to receive the valid scan pulse, the constant current power input terminal 223 may be configured to input positive power, and the output terminal 224 may be configured to output a constant drive current to the LED unit 21. The pulse-width modulation chip 22 may be configured to be activated when a valid scan pulse is inputted via the scan signal terminal 222 and to adjust the light-emitting duration of the LED unit 21 electrically connected to the pulse-width modulation chip 22 according to the data signal inputted via the data signal terminal 221, thereby implementing the display grayscale of the LED unit 21.

Figure 9:
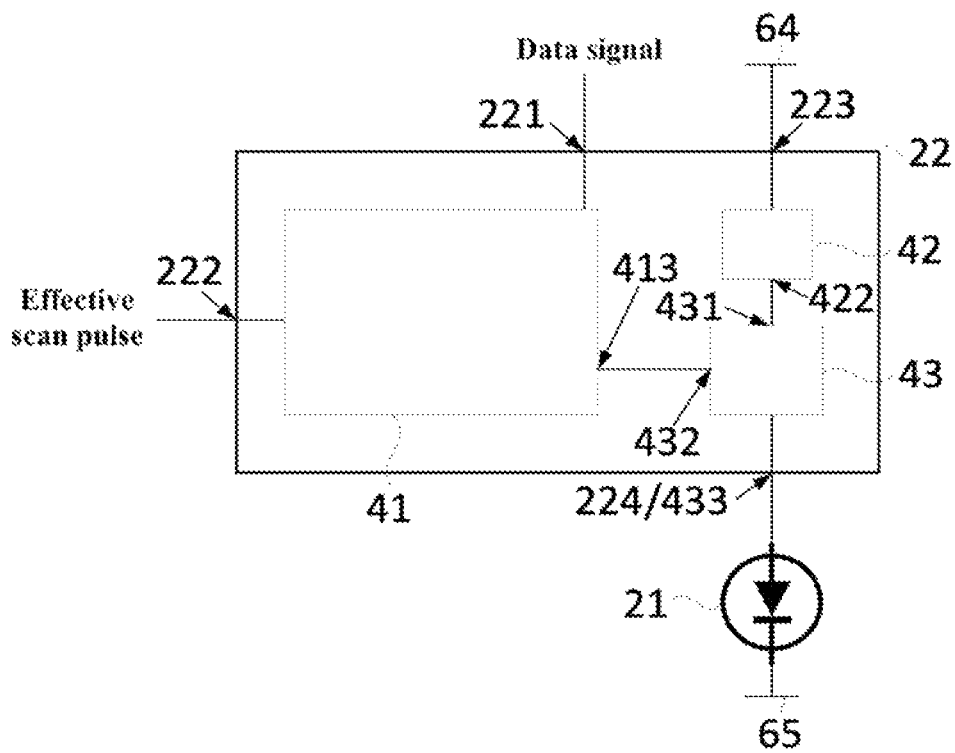
FIG. 9 illustrates a structural schematic of another pulse-width modulation chip according to various embodiments of the present disclosure.

FIG. 9 illustrates a structural schematic of another pulse-width modulation chip according to various embodiments of the present disclosure. As shown in FIG. 9, the pulse-width modulation chip 22 may include a pulse-width modulation unit 41, a constant current unit 42, and a switch unit 43. The pulse-width modulation unit 41 may include the data signal terminal 221 and the scan signal terminal 222. The constant current unit 42 may include the constant current power input terminal 223; and an output terminal 422 of the constant current unit 42 may be electrically connected to a first terminal 431 of the switch unit 43. The constant current unit 42 may be configured to input a constant drive current to the switch unit 43. A control terminal 432 of the switch unit 43 may be electrically connected to an output terminal 413 of the pulse-width modulation unit 41; and a second terminal 433 of the switch unit 43 may be the output terminal 224 of the pulse-width modulation chip 22. The pulse-width modulation unit 41 may be configured to be activated when a valid scan pulse is inputted via the scan signal terminal 222 and to adjust the pulse-width of the outputted pulse signal according to the data signal inputted via the data signal terminal 221. The switch unit 43 may be configured to control the light-emitting duration of the LED unit 21 according to the pulse signal.

For example, the constant current unit 42 and the switch unit 43 may be located in the pulse-width modulation chip 22. The data signal terminal 221 of the pulse-width modulation unit 41 may be configured as the data signal terminal 221 of the pulse-width modulation chip 22 for receiving the data signal. The scan signal terminal 222 of the pulse-width modulation unit 41 may be configured as the scan signal terminal 222 of the pulse-width modulation chip 22 for receiving the effective scan pulse. The constant current power input terminal 223 of the constant current unit 42 may be configured as the constant current power input terminal 223 of the pulse-width modulation chip 22 for inputting positive power. The second terminal 433 of the switch unit 43 may be configured as the output terminal 224 of the pulse-width modulation chip 22 for outputting a constant drive current to the LED unit 21.

The pulse-width modulation unit 41 may be activated when a valid scan pulse is inputted via the scan signal terminal 222 and to adjust the pulse-width of the outputted pulse signal according to the data signal inputted via the data signal terminal 221. The constant current unit 42 may be configured to input a constant drive current to the switch unit 43; and the switch unit 43 may be in a conduction or disconnection state according to a received pulse signal. When the switch unit 43 is in the conduction state, the constant drive current provided by the constant current unit 42 may be transmitted to the LED unit 21 through the switch unit 43, thereby driving the LED unit 21 to emit light. When the switch unit 43 is in the disconnection state, the constant drive current provided by the constant current unit 42 cannot be transmitted to the LED unit 21 through the switch unit 43, such that the LED unit 21 may not emit light. Therefore, by adjusting the pulse-width of the outputted pulse signal, the conduction duration of the switch unit 43 may be controlled, such that the light-emitting duration of the LED unit 21 may be controlled, thereby implementing the grayscale display of the LED unit 21.

The display panel provided by the embodiments of the present disclosure may convert the data signal into the conduction duration of the switch unit 43 and control the display grayscale by controlling the light-emitting duration of the LED unit 21. For different display grayscales, the constant drive current flowing through the LED unit 21 may have a same magnitude, thereby implementing the constant current driving of the LED unit 21. Furthermore, the high luminous efficiency characteristics of the LED unit 21 at high current may be fully utilized, such that the luminous efficiency of the LED unit 21 may be relatively high in any grayscale including the low grayscale range. Furthermore, it may avoid that the expected luminous brightness may not be achieved due to the low luminous efficiency of the LED unit 21, which may affect the display effect.

Figure 10:
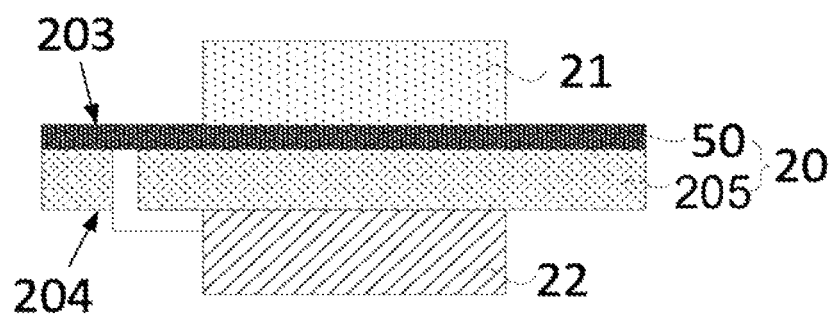
FIG. 10 illustrates a local cross-sectional structural schematic of a display panel according to various embodiments of the present disclosure.
Figure 11:
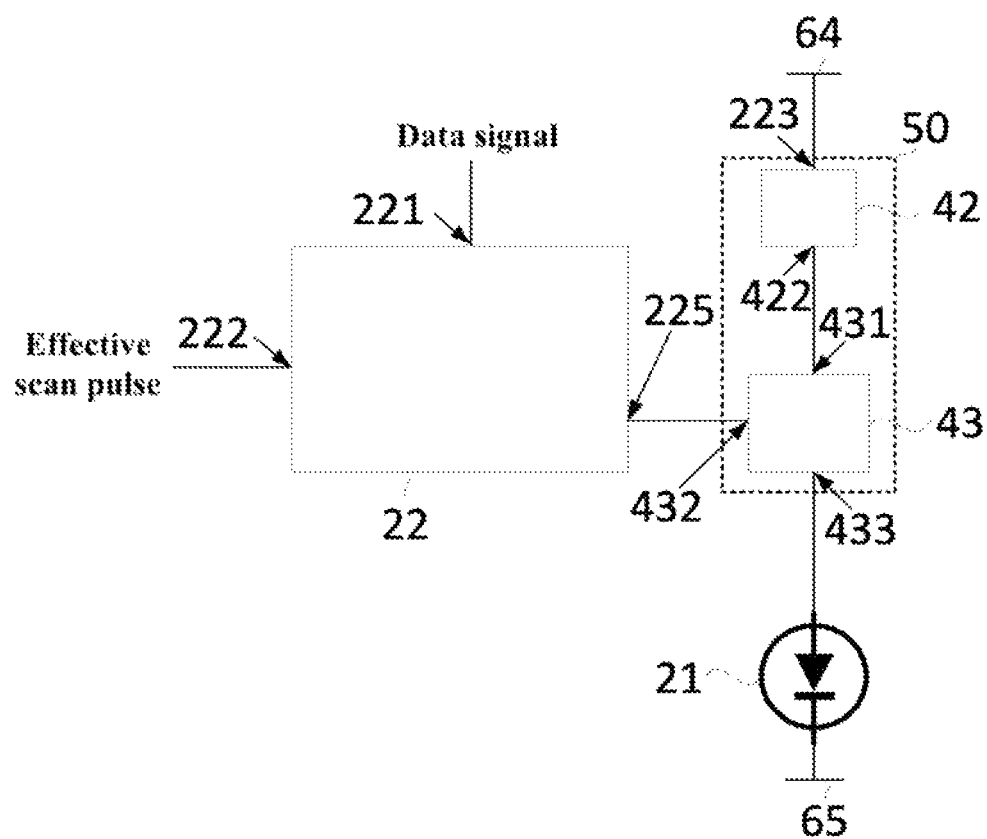
FIG. 11 illustrates a structural schematic of another pulse-width modulation chip according to various embodiments of the present disclosure.

Optionally, FIG. 10 illustrates a local cross-sectional structural schematic of a display panel according to various embodiments of the present disclosure; and FIG. 11 illustrates a structural schematic of another pulse-width modulation chip according to various embodiments of the present disclosure. As shown in FIGS. 10-11, the substrate 20 may include a base substrate 205 and a plurality of constant current switch units 50 located at one side of the base substrate 205. The plurality of constant current switch units 50 and the plurality of pulse-width modulation chips 22 may be in a one-to-one correspondence. The constant current switch unit 50 may include the constant current unit 42 and the switch unit 43. The pulse-width modulation chip 22 may be electrically connected to the LED unit 21 through the constant current switch unit 50. The pulse-width modulation chip 22 may include the data signal terminal 221, the scan signal terminal 222, and the output terminal 225. The output terminal 225 of the pulse-width modulation chip 22 may be electrically connected to the control terminal 432 of the switch unit 43, and the first terminal 431 of the switch unit 43 may be electrically connected to the output terminal 422 of the constant current unit 42. The constant current unit 42, including the constant current power input terminal 223, may be configured to input a constant drive current to the switch unit 43. The second terminal 433 of the switch unit 43 may be electrically connected to the LED unit 21. The pulse-width modulation chip 22 is configured to be activated when a valid scan pulse is inputted via the scan signal terminal 222 and to adjust the pulse-width of the pulse signal outputted to the switch unit 43 electrically connected to the pulse-width modulation chip 22 according to the data signal inputted via the data signal terminal 221. In such way, the switch unit 43 may control the light-emitting duration of the LED unit 21 according to the pulse signal.

For example, the constant current power input terminal 223 of the constant current unit 42 may be configured to input positive power, the data signal terminal 221 of the pulse-width modulation chip 22 may be configured to receive the data signal, and the scan signal terminal 222 of the pulse-width modulation chip 22 may be configured to receive the effective scan pulse. The output terminal 422 of the constant current unit 42 may be electrically connected to the first terminal 431 of the switch unit 43, and the constant current unit 42 may be configured to input a constant drive current to the switch unit 43. The pulse-width modulation chip 22 may be activated when a valid scan pulse is inputted via the scan signal terminal 222 and to adjust the pulse-width of the pulse signal outputted to the switch unit 43 electrically connected to the pulse-width modulation chip 22 according to the data signal inputted via the data signal terminal 221. The switch unit 43 may be in a conduction or disconnection state according to a received pulse signal. When the switch unit 43 is in the conduction state, the constant drive current provided by the constant current unit 42 may be transmitted to the LED unit 21 through the switch unit 43, thereby driving the LED unit 21 to emit light. When the switch unit 43 is in the disconnection state, the constant drive current provided by the constant current unit 42 cannot be transmitted to the LED unit 21 through the switch unit 43, such that the LED unit 21 may not emit light. Therefore, by adjusting the pulse-width of the outputted pulse signal by the pulse-width modulation chip 22, the conduction duration of the switch unit 43 may be controlled, and furthermore, the light-emitting duration of the LED unit 21 may be controlled, thereby implementing the grayscale display of the LED unit 21.

It should be noted that the constant current switch unit 50 and the pulse-width modulation chip 22 may be disposed at a same side or different sides of the base substrate 205. Disposing the constant current switch unit 50 and the pulse-width modulation chip 22 at different sides of the base substrate 205 may be taken as an example in FIG. 10, which may not be limited according to the embodiments of the present disclosure.

Figure 12:
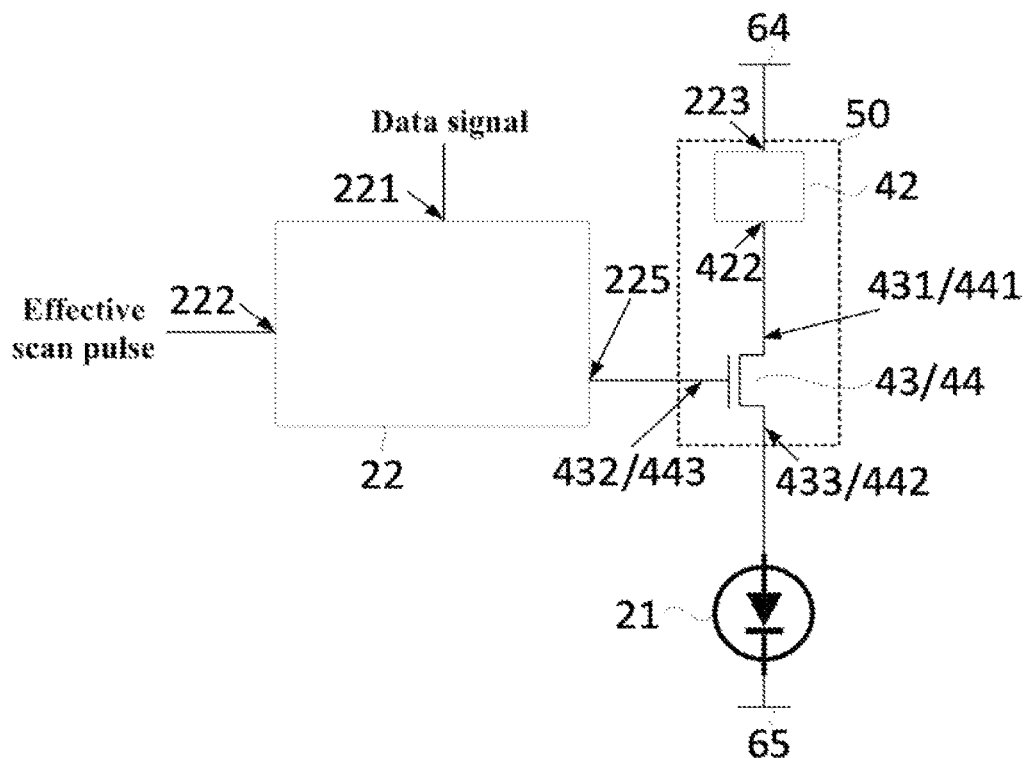
FIG. 12 illustrates a structural schematic of another pulse-width modulation chip according to various embodiments of the present disclosure.

FIG. 12 illustrates a structural schematic of another pulse-width modulation chip according to various embodiments of the present disclosure. As shown in FIG. 12, optionally, the switch unit 43 may include a switch transistor 44, a first electrode 441 of the switch transistor 44 may be electrically connected to the output terminal 422 of the constant current unit 42, and a second electrode 442 of the switch transistor 44 may be electrically connected to the LED unit 21.

For example, the switch transistor 44 may be used as the switch unit 43, the first electrode 441 of the switch transistor 44 may be used as the first terminal 431 of the switch unit 43, and the second electrode 442 of the switch transistor 44 may be used as the second terminal 433 of the switch unit 43. The switch transistor 44 may further include a control terminal 443, and the control terminal 443 of the switch transistor 44 may be used as the control terminal 432 of the switch unit 43. The constant current unit 42 may be configured to input a constant drive current to the first electrode 441 of the switch transistor 44. The pulse-width modulation chip 22 may be activated when a valid scan pulse is inputted via the scan signal terminal 222 and may adjust the pulse-width of the pulse signal according to the data signal inputted via the data signal terminal 221 and input the pulse signal to the control terminal 443 of the switch transistor 44. The switch transistor 44 may be in a conduction or disconnection state according to the pulse signal received by the control terminal 443. When the switch unit 43 is in the conduction state, the constant drive current provided by the constant current unit 42 may be transmitted to the LED unit 21 through the switch unit 43, thereby driving the LED unit 21 to emit light. When the switch unit 43 is in the disconnection state, the constant drive current provided by the constant current unit 42 cannot be transmitted to the LED unit 21 through the switch unit 43, such that the LED unit 21 may not emit light. Therefore, by adjusting the pulse-width of the outputted pulse signal by the pulse-width modulation chip 22, the conduction duration of the switch transistor 44 may be controlled, and furthermore, the light-emitting duration of the LED unit 21 may be controlled, thereby implementing the grayscale display of the LED unit 21.

The switch transistor 44 may include a thin film transistor which may be an N-type thin film transistor or a P-type thin film transistor. The types of thin film transistors may include amorphous silicon thin film transistors, oxide thin film transistors, and polysilicon thin film transistors, which may be configured by those skilled in the art according to actual needs.

Figure 13:
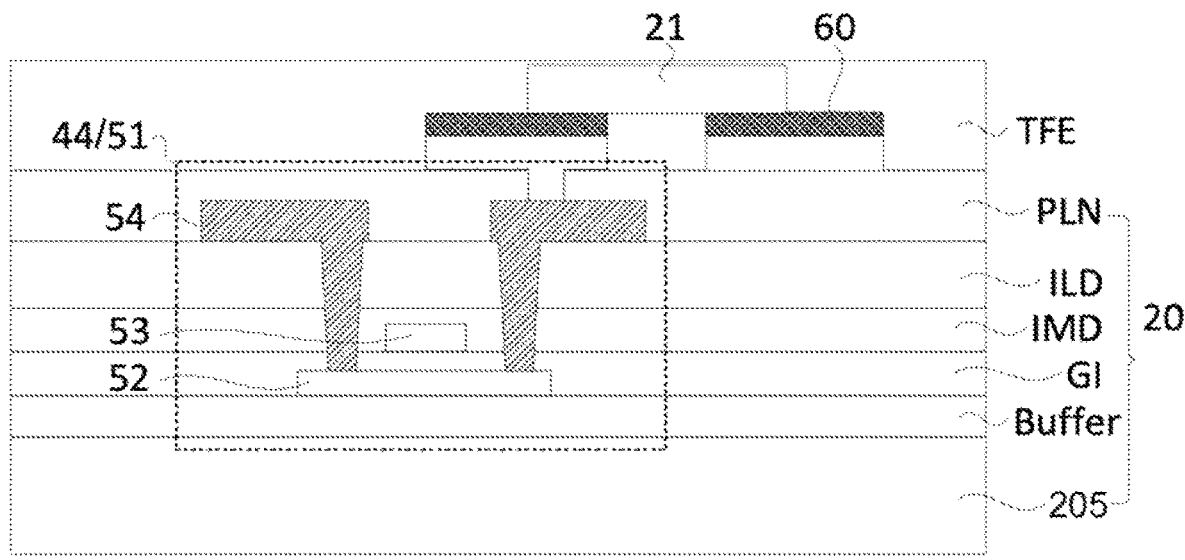
FIG. 13 illustrates a local cross-sectional structural schematic of another display panel according to various embodiments of the present disclosure.

For example, FIG. 13 illustrates a local cross-sectional structural schematic of another display panel according to various embodiments of the present disclosure. Disposing the constant current switch unit 50 and the pulse-width modulation chip 22 at different sides of the base substrate 205 may be taken as an example in FIG. 13. The switch transistor 44 in the constant current switch unit 50 may be disposed at the side of the base substrate 205 away from the pulse-width modulation chip 22 (not shown in FIG. 13). The switch transistor 44 may include a thin film transistor 51; and the thin film transistor 51 may include a buffer layer, a gate insulation layer (GI), a metal insulation layer (IMD), an interlayer insulation layer (ILD), a planarization layer (PLN) which are stacked on a side of the base substrate 205, and further include an active layer 52 at the side of the buffer layer away from the base substrate 205, a gate metal layer 53 at the side of the gate insulation layer (GI) away from the base substrate 205, and a source/drain metal layer 54 at the side of the interlayer insulation layer (ILD) away from the base substrate 205. The source/drain metal layer 54 may be electrically connected to the active layer 52 through a via hole disposed on the gate insulation layer (GI), the metal insulation layer (IMD), and the interlayer insulation layer (ILD). The LED unit 21 may be electrically connected to the source/drain metal layer 54 through a via hole disposed on the planarization layer PLN. A eutectic electrode layer 60 may be further included between the LED unit 21 and the source/drain metal layer 54, such that the LED unit 21 may be electrically connected to the source/drain metal layer 54 through eutectic bonding.

Figure 14:
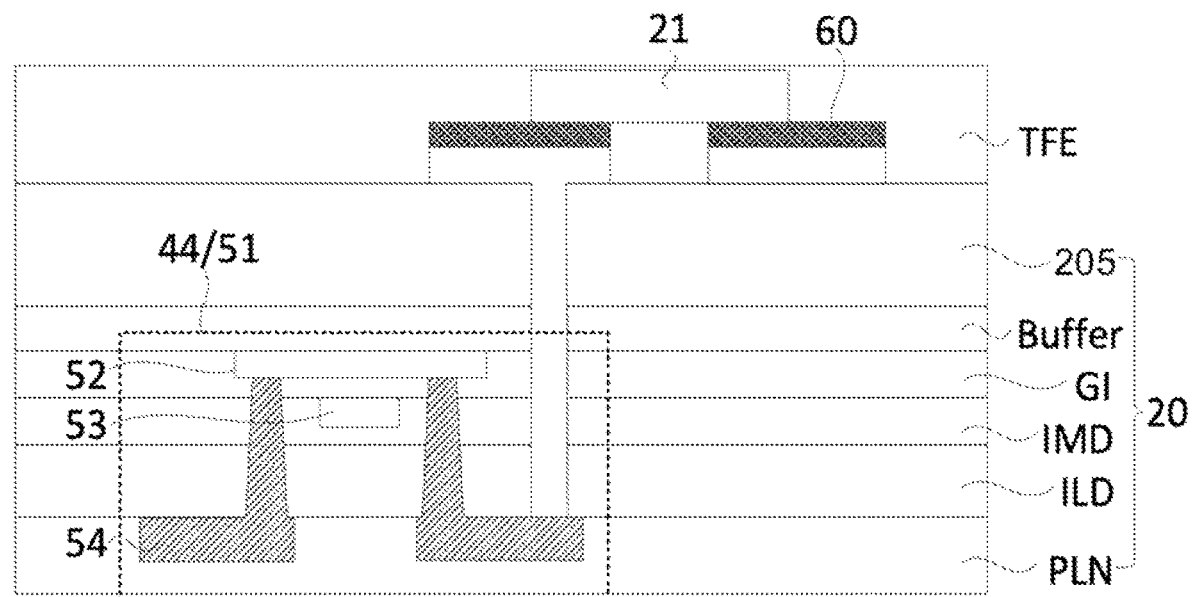
FIG. 14 illustrates a local cross-sectional structural schematic of another display panel according to various embodiments of the present disclosure.

FIG. 14 illustrates a local cross-sectional structural schematic of another display panel according to various embodiments of the present disclosure. Disposing the constant current switch unit 50 and the pulse-width modulation chip 22 at a same side of the base substrate 205 may be taken as an example in FIG. 14. The switch transistor 44 in the constant current switch unit 50 may be disposed at the side of the base substrate 205 adjacent to the pulse-width modulation chip 22 (not shown in FIG. 14). The switch transistor 44 may include the thin film transistor 51; and the thin film transistor 51 may include the buffer layer, the gate insulation layer (GI), the metal insulation layer (IMD), the interlayer insulation layer (ILD), a planarization layer (PLN), which are at the side of the base substrate 205, and further include the active layer 52 at the side of the buffer layer away from the base substrate 205, the gate metal layer 53 at the side of the gate insulation layer (GI) away from the base substrate 205, and the source/drain metal layer 54 at the side of the interlayer insulation layer (ILD) away from the base substrate 205. The source/drain metal layer 54 may be electrically connected to the active layer 52 through a via hole disposed on the gate insulation layer (GI), the metal insulation layer (IMD), and the interlayer insulation layer (ILD). The LED unit 21 may be electrically connected to the source/drain metal layer 54 through a via hole disposed at the substrate 20. The eutectic electrode layer 60 may be further included between the LED unit 21 and the source/drain metal layer 54, such that the LED unit 21 may be electrically connected to the source/drain metal layer 54 through eutectic bonding.

Referring to FIGS. 13-14, optionally, the display panel may further include an encapsulation layer (TFE) at the side of the LED unit 21 away from the substrate 20. The encapsulation layer TFE may isolate the external water vapor and protect the LED unit 21.

Figure 15:
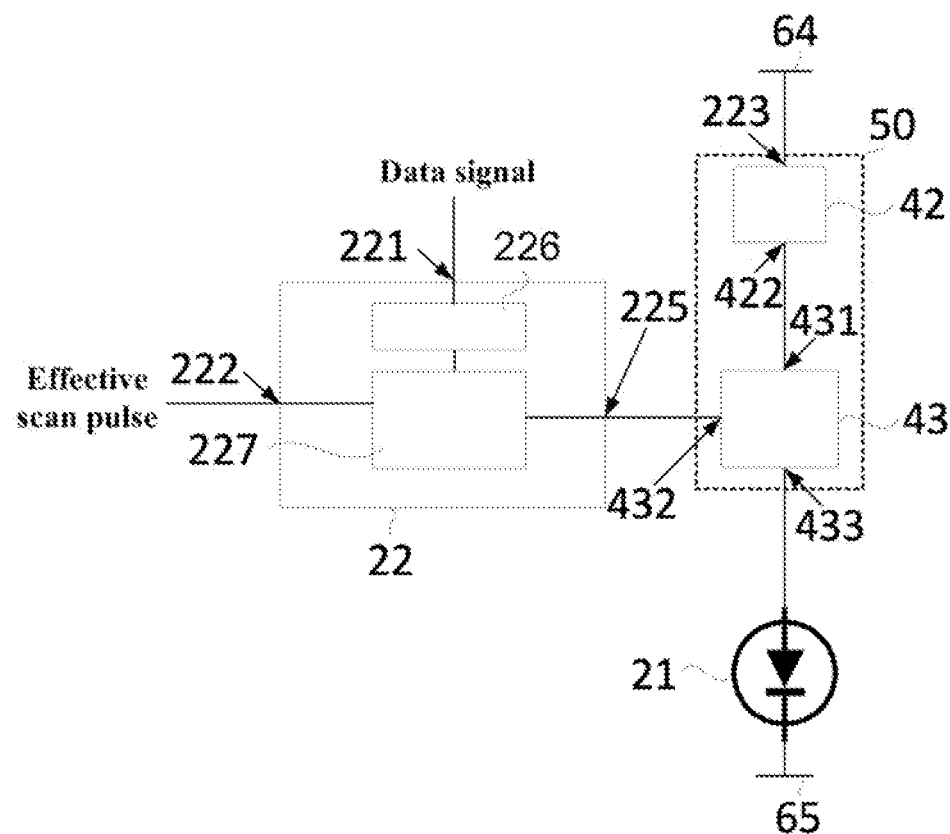
FIG. 15 illustrates a structural schematic of another pulse-width modulation chip according to various embodiments of the present disclosure.

FIG. 15 illustrates a structural schematic of another pulse-width modulation chip according to various embodiments of the present disclosure. As shown in FIG. 15, optionally, the pulse-width modulation chip 22 may include a register 226 and a state machine 227. The register 226 may be electrically connected to the data signal terminal 221, and the state machine 227 may be electrically connected to the scan signal terminal 222, the register 226, and the switch unit 43, respectively. The state machine 227 may be configured to control the state machine 227 to start or shut down according to the scan signal inputted via the scan signal terminal 222. The register 226 may be configured to store the data signal inputted via the data signal terminal 221. The state machine 227 may also be configured to adjust the pulse-width of the outputted pulse signal according to the scan signal inputted via the scan signal terminal 222 and the data signal read from the register 226.

The data signal may be first transmitted to the register 226 which is configured to store the data signal. The state machine 227 may be configured to control the state machine 227 to start or shut down according to the scan signal inputted via the scan signal terminal 222. The state machine 227 may also be configured to adjust the pulse-width of the outputted pulse signal according to the scan signal inputted via the scan signal terminal 222 and the data signal read from the register 226. For example, the scan signal may include a valid scan pulse. The state machine 227 may be activated when a valid scan pulse is inputted via the scan signal terminal 222 and may adjust the pulse-width of the pulse signal outputted to the switch unit 43 electrically connected to the state machine 227 according to the data signal read from the register 226. The switch unit 43 may be in the conduction or disconnection state according to the received pulse signal. When the switch unit 43 is in the conduction state, the constant drive current provided by the constant current unit 42 may be transmitted to the LED unit 21 through the switch unit 43, thereby driving the LED unit 21 to emit light. When the switch unit 43 is in the disconnection state, the constant drive current provided by the constant current unit 42 cannot be transmitted to the LED unit 21 through the switch unit 43, such that the LED unit 21 may not emit light. Therefore, by adjusting the pulse-width of the outputted pulse signal by the state machine 227, the conduction duration of the switch unit 43 may be controlled, and furthermore, the light-emitting duration of the LED unit 21 may be controlled, thereby implementing the grayscale display of the LED unit 21.

Figure 16:
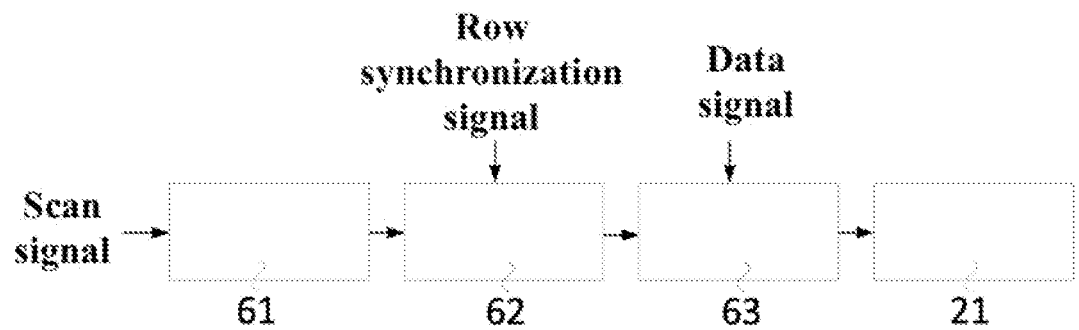
FIG. 16 illustrates a working flowchart of a pulse-width modulation chip according to various embodiments of the present disclosure.

FIG. 16 illustrates a working flowchart of a pulse-width modulation chip according to various embodiments of the present disclosure. As shown in FIG. 16, optionally, the state machine 227 may include a PWM signal switch unit 61, a signal synchronization unit 62, and a PWM signal generation unit 63. The PWM signal switch unit 61 may be activated based on the received scan signal and may generate an enable signal. The signal synchronization unit 62 may obtain a row synchronization signal of the drive chip 23 and output the enable signal generated by the PWM signal switch unit 61 to the PWM signal generating unit 63 when receiving the falling edge of the row synchronization signal. After receiving the enable signal, the PWM signal generating unit 63 may generate a PWM signal corresponding to the pulse-width according to the data signal and further control the light-emitting duration of the LED unit 21, thereby implementing the display grayscale of the LED unit 21.

Figure 17:
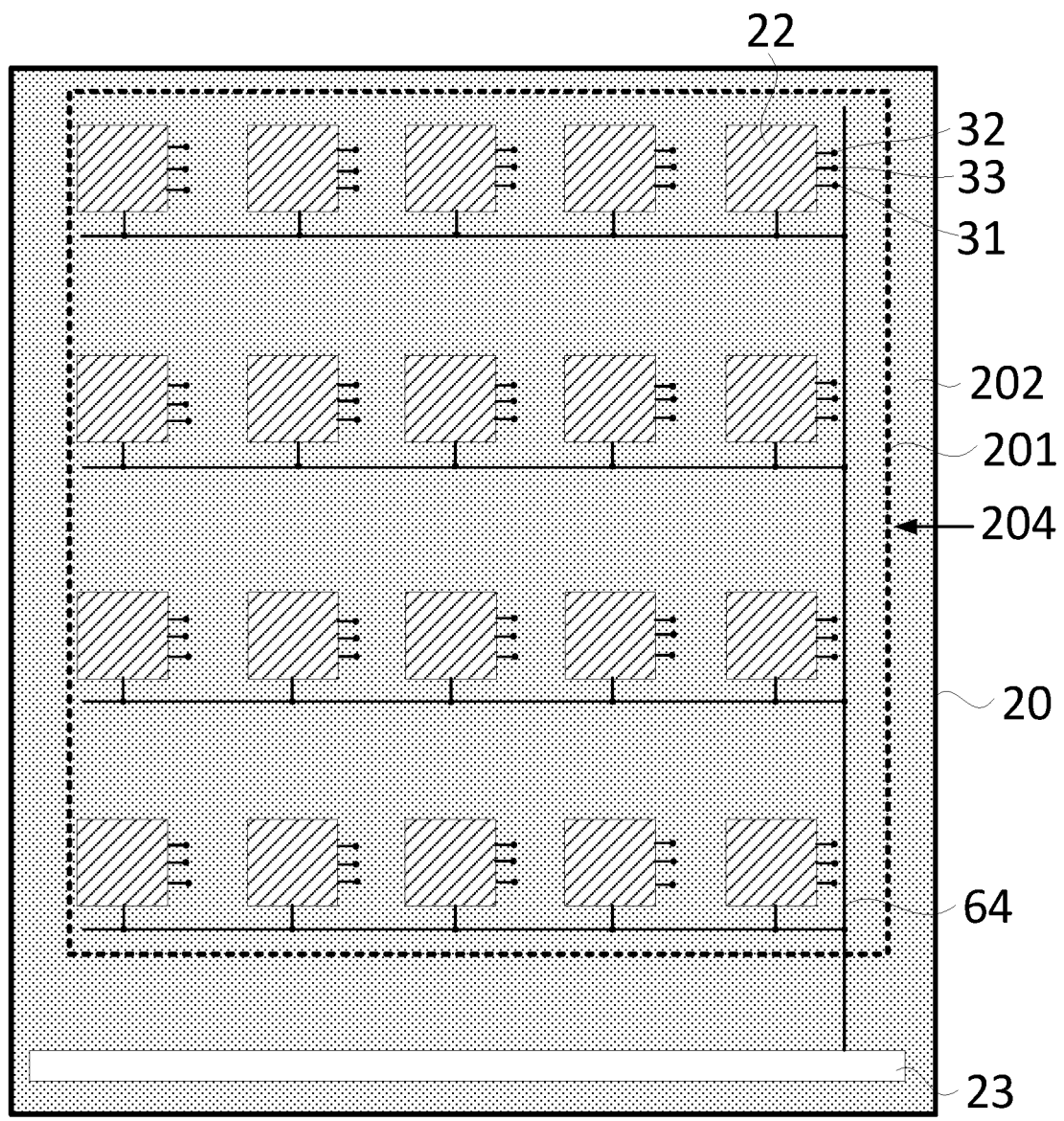
FIG. 17 illustrates a structural schematic of another display panel according to various embodiments of the present disclosure.

FIG. 17 illustrates a structural schematic of another display panel according to various embodiments of the present disclosure. As shown in FIG. 8 and FIG. 17, optionally, a plurality of positive power signal lines 64 may be further disposed on the substrate 20. The positive power signal line 64 may be electrically connected to the constant current power input terminal 223. The positive power signal line 64 and the pulse-width modulation chip 22 may be located on a same side of the substrate 20.

For example, the positive power signal line 64 may be electrically connected to the constant current power input terminal 223 to provide positive power to the constant current unit 42. The constant current unit 42 may be configured to convert the positive power into the constant drive current, where the positive power may be the PVDD power voltage. The positive power signal line 64 and the pulse-width modulation chip 22 may be disposed at a same side of the substrate 20, such that the positive power signal line 64 may be directly connected to the pulse-width modulation chip 22, and there is no need to fabricate additional via holes on the substrate 20, which is beneficial for reducing the fabrication process steps and the fabrication cost.

Figure 18:
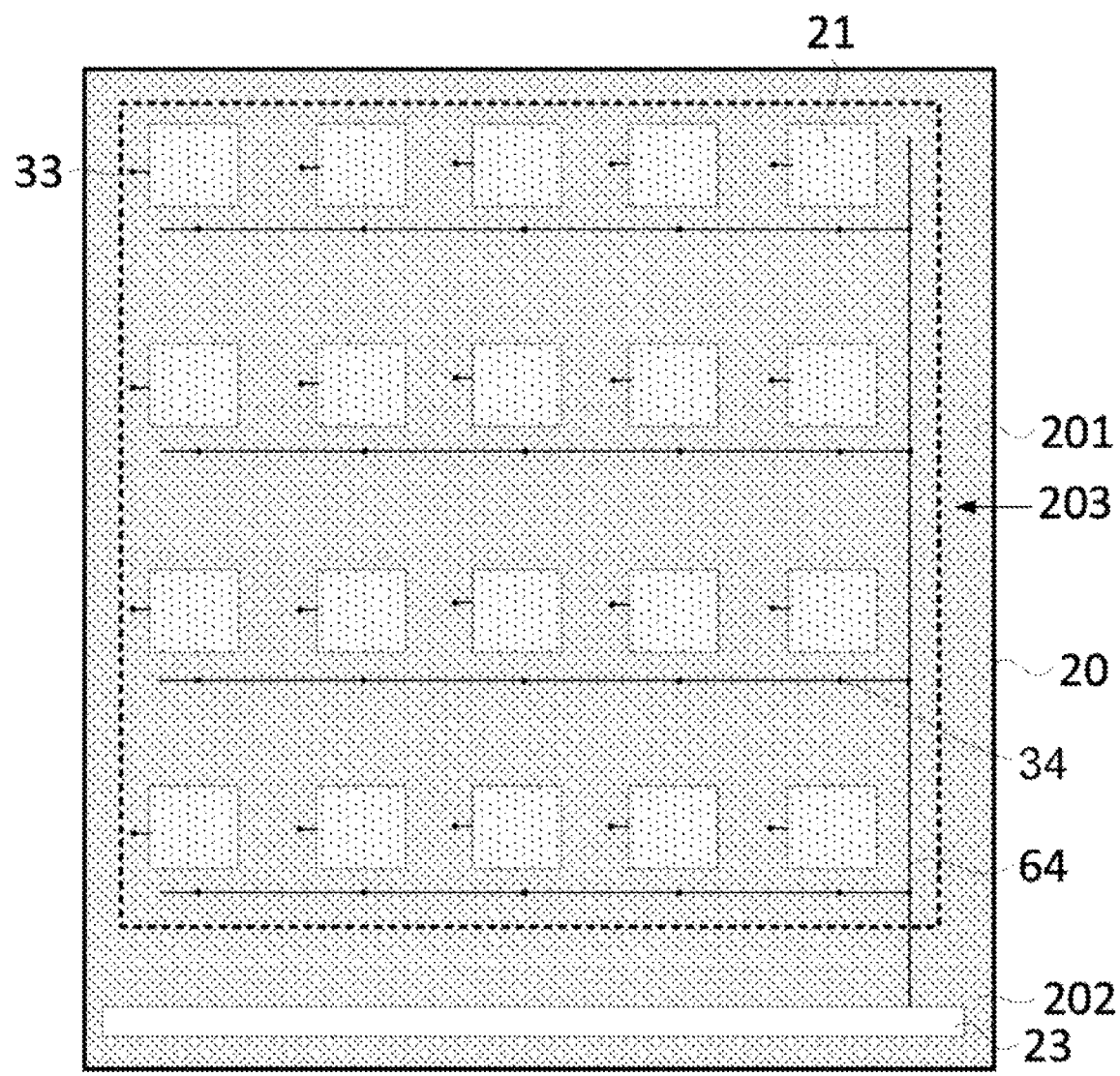
FIG. 18 illustrates a structural schematic of a first side of another display panel according to various embodiments of the present disclosure.
Figure 19:
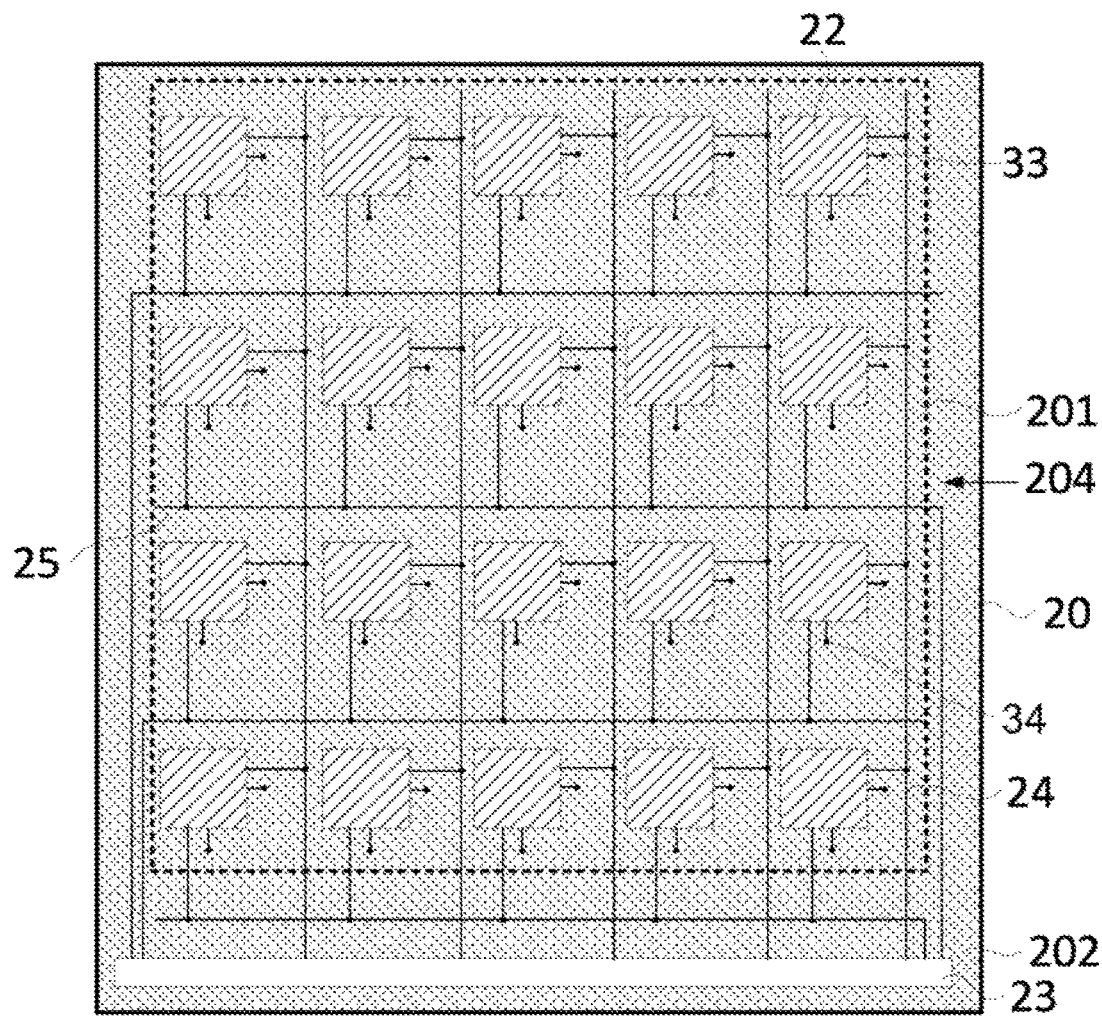
FIG. 19 illustrates a structural schematic of a second side of another display panel according to various embodiments of the present disclosure.

FIG. 18 illustrates a structural schematic of a first side of another display panel according to various embodiments of the present disclosure; and FIG. 19 illustrates a structural schematic of a second side of another display panel according to various embodiments of the present disclosure. As shown in FIG. 8, FIG. 18, and FIG. 19, optionally, the plurality of positive power signal lines 64 may be further provided on the substrate 20, and the substrate 20 may further includes a plurality of fourth via holes 34. The positive power signal line 64 and the pulse-width modulation chip 22 may be located at different sides of the substrate 20; and the positive power signal line 64 may be electrically connected to the constant current power input terminal 223 through the fourth via hole 34.

For example, the positive power signal line 64 may be located at the first side 203 of the substrate 20; the pulse-width modulation chip 22 may be located at the second side 204 of the substrate 20; and the positive power signal line 64 may be electrically connected to the constant current power input terminal 223 through the fourth via hole 34 to provide positive power to the constant current unit 42.

Figure 20:
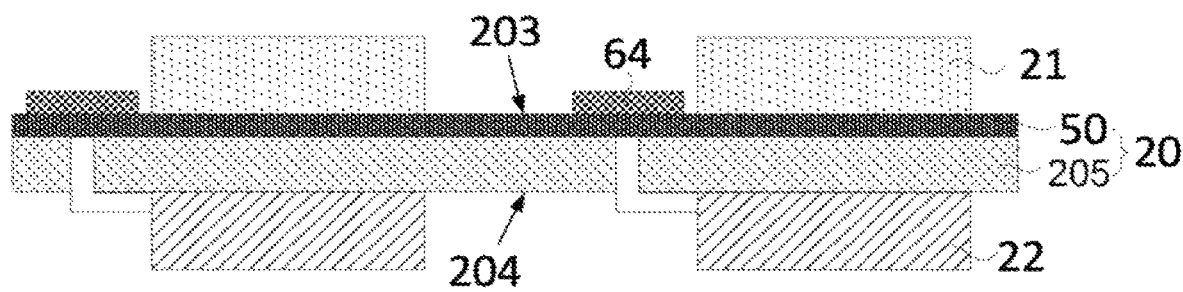
FIG. 20 illustrates a local cross-sectional structural schematic of another display panel according to various embodiments of the present disclosure.

FIG. 20 illustrates a local cross-sectional structural schematic of another display panel according to various embodiments of the present disclosure. As shown in FIG. 11 and FIG. 20, the plurality of positive power signal lines 64 may also disposed at the substrate 20; and the positive power signal line 64 and the constant current switch unit 50 may be located at a same side of the base substrate 205.

For example, the positive power signal line 64 may be electrically connected to the constant current power input terminal 223 of the constant current switch unit 50 to provide positive power for the constant current switch unit 50. The positive power signal line 64 and the constant current switch unit 50 may be disposed at a same side of the substrate 20, such that the positive power signal line 64 may be directly connected to the constant current switch unit 50, and there is no need to fabricate additional via holes on the base substrate 205, which is beneficial for reducing the fabrication process steps and the fabrication cost.

Figure 21:
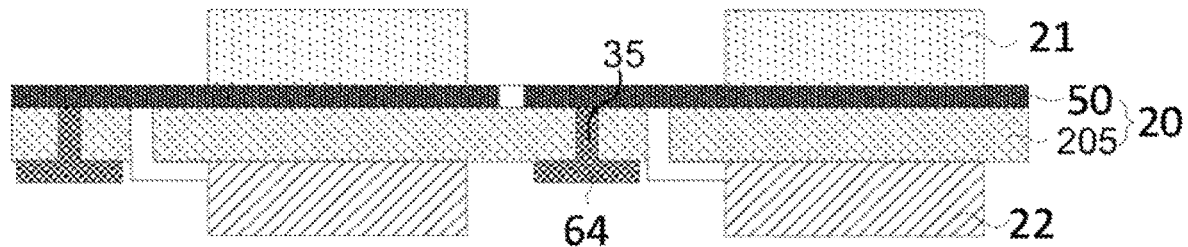
FIG. 21 illustrates a local cross-sectional structural schematic of another display panel according to various embodiments of the present disclosure.

FIG. 21 illustrates a local cross-sectional structural schematic of another display panel according to various embodiments of the present disclosure. As shown in FIG. 11 and FIG. 21, optionally, the plurality of positive power signal lines 64 may be further disposed on the substrate 20, and the substrate 20 may further include a plurality of fifth via holes 35. The positive power signal line 64 and the constant current switch unit 50 may be located at different sides of the base substrate 205, and the positive power signal line 64 may be electrically connected to the constant current power input terminal 223 through the fifth via hole 35.

For example, the constant current switch unit 50 and the positive power signal line 64 may be respectively located at different sides of the base substrate 205, and the positive power signal line 64 may be electrically connected to the constant current switch unit 50 through the fifth via hole 35, thereby providing positive power for the constant current switch unit 50.

Figure 22:
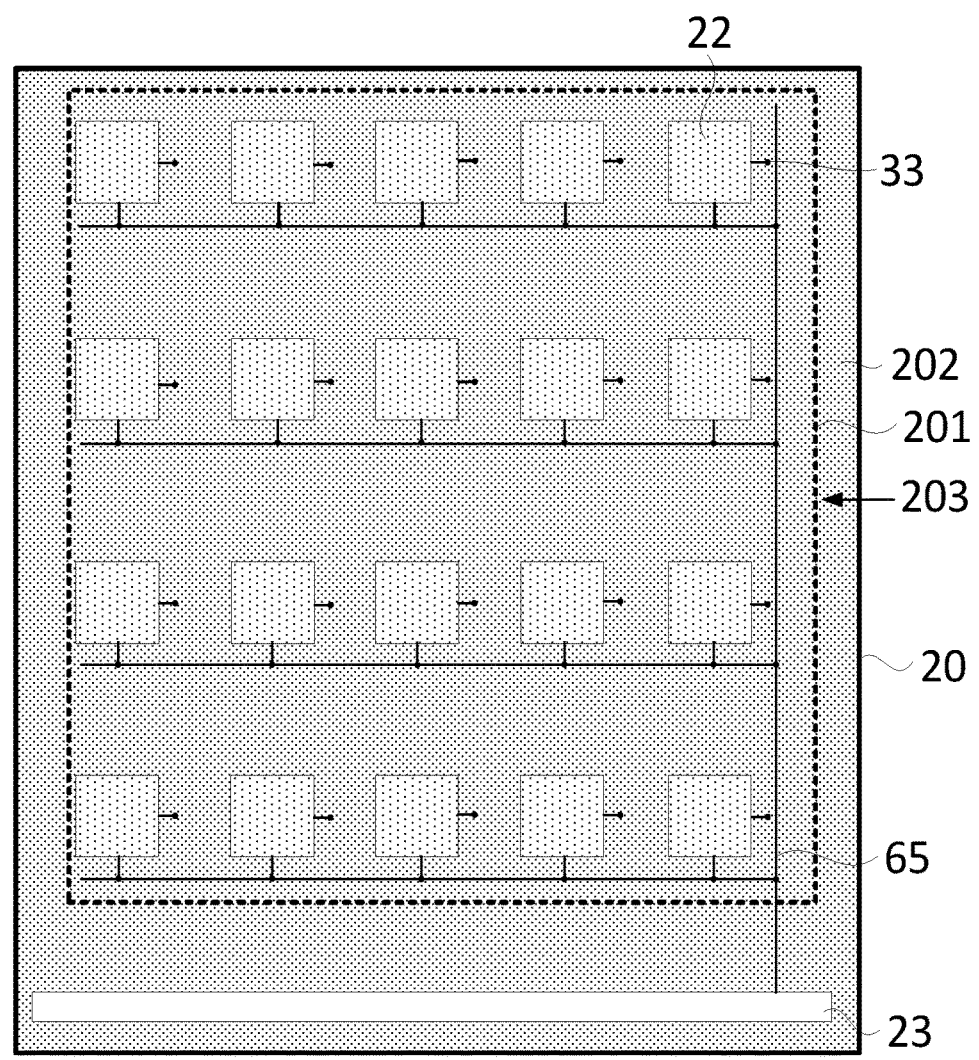
FIG. 22 illustrates a structural schematic of another display panel according to various embodiments of the present disclosure.

FIG. 22 illustrates a structural schematic of another display panel according to various embodiments of the present disclosure. As shown in FIG. 9 and FIG. 22, optionally, a plurality of negative power signal lines 65 may be disposed at the substrate 20 and each LED unit 21 may be electrically connected to the negative power signal line 65.

For example, the negative power signal line 65 may be electrically connected to the LED unit 21 to provide negative power for the LED unit 21, thereby providing a current loop when the LED unit 21 emits light, where the negative power may be PVEE power voltage or GND.

Referring to FIG. 22, optionally, the negative power signal line 65 and the LED unit 21 may be located at a same side of the substrate 20.

The negative power signal line 65 and the LED unit 21 may be disposed at the same side of the substrate 20, such that the negative power signal line 65 may be directly connected to the LED unit 21, and there is no need to fabricate additional via holes on the substrate 20, which is beneficial for reducing the fabrication process steps and the fabrication cost.

Figure 23:
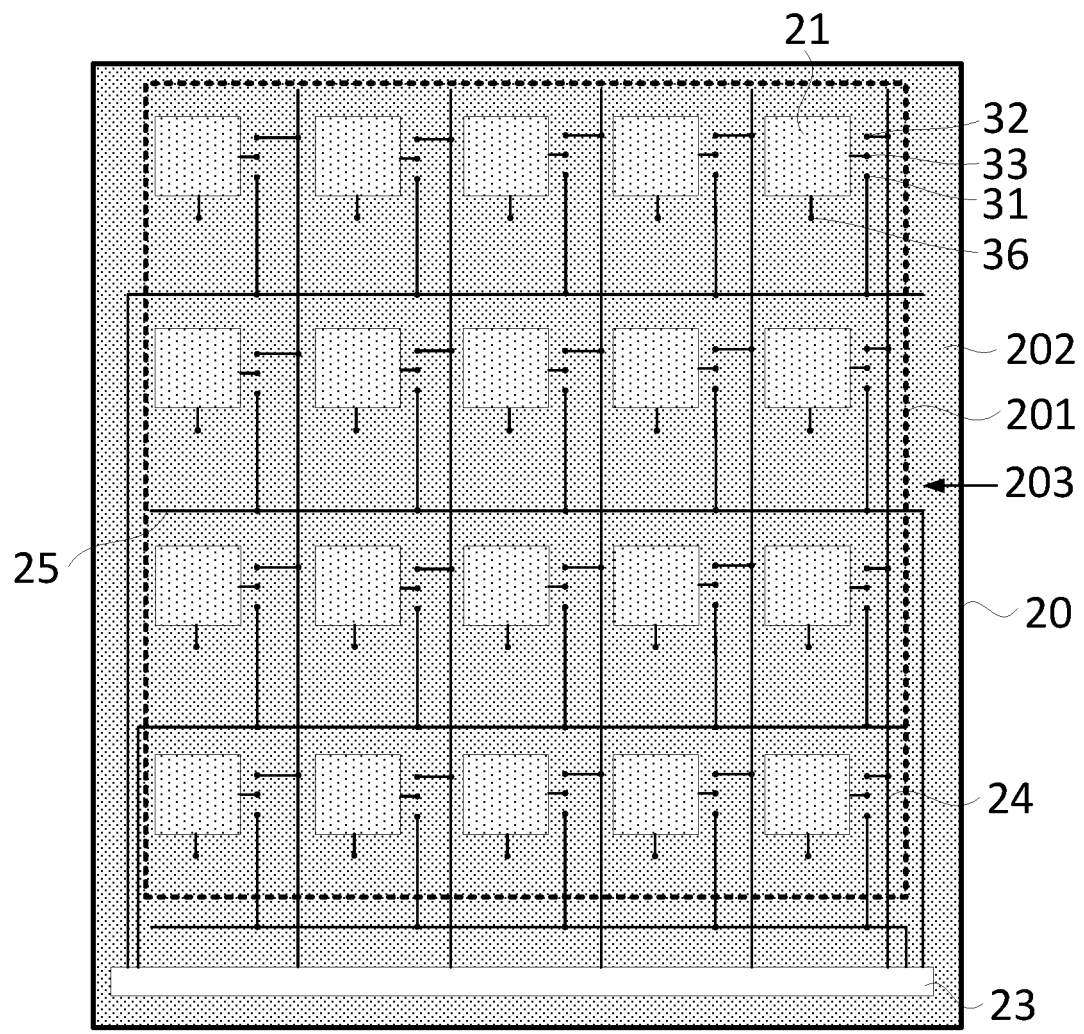
FIG. 23 illustrates a structural schematic of a first side of another display panel according to various embodiments of the present disclosure.
Figure 24:
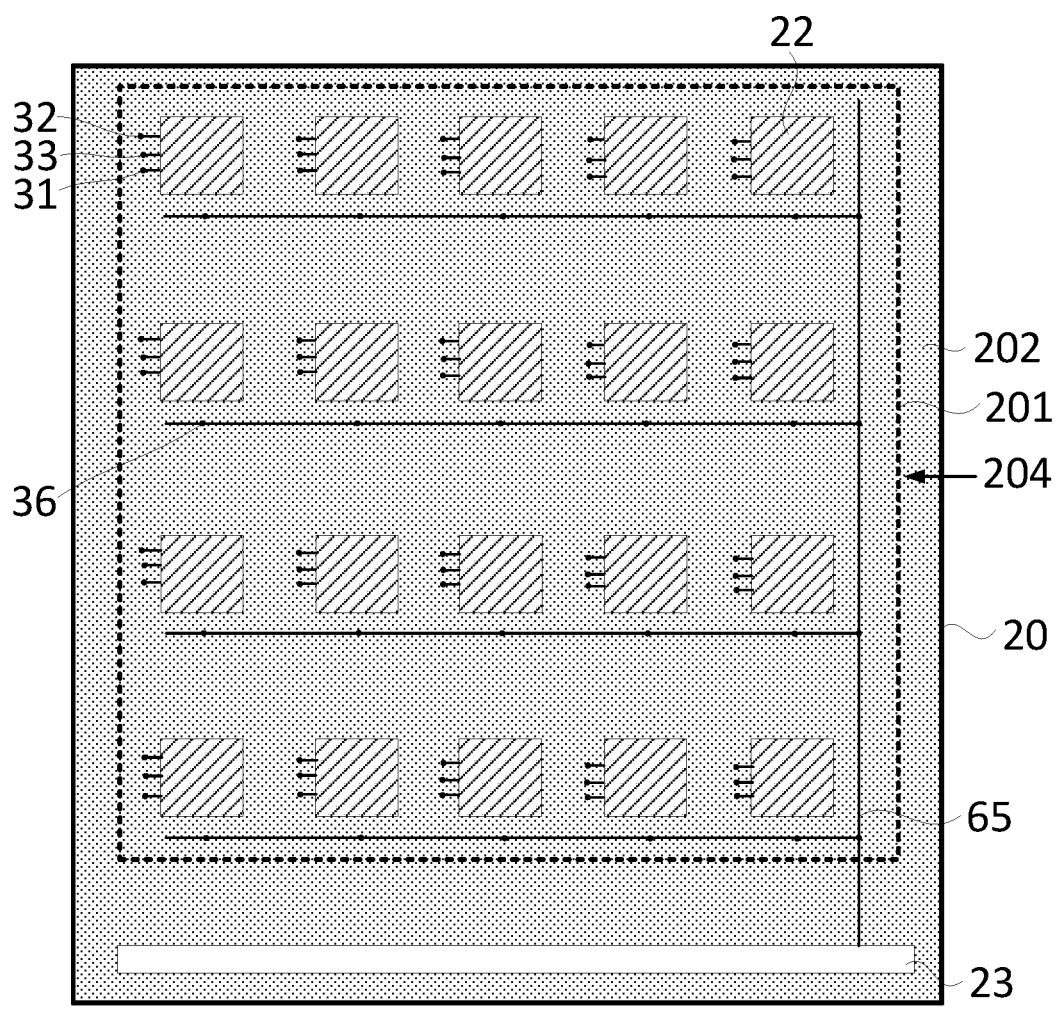
FIG. 24 illustrates a structural schematic of a second side of another display panel according to various embodiments of the present disclosure.

FIG. 23 illustrates a structural schematic of a first side of another display panel according to various embodiments of the present disclosure; and FIG. 24 illustrates a structural schematic of a second side of another display panel according to various embodiments of the present disclosure. As shown in FIGS. 23-24, optionally, the negative power signal line 65 and the LED unit 21 may be located at different sides of the substrate 20, and the substrate 20 may include a plurality of sixth via holes 36. The negative power signal line 65 may be electrically connected to the LED unit 21 through the sixth via hole 36.

For example, the LED unit 21 may be located at the first side 203 of the substrate 20, the negative power signal line 65 may be located at the second side 204 of the substrate 20, and the negative power signal line 65 may be electrically connected to the LED unit 21 through the sixth via 36, thereby providing a current loop when the LED unit 21 emits light.

Figure 25:
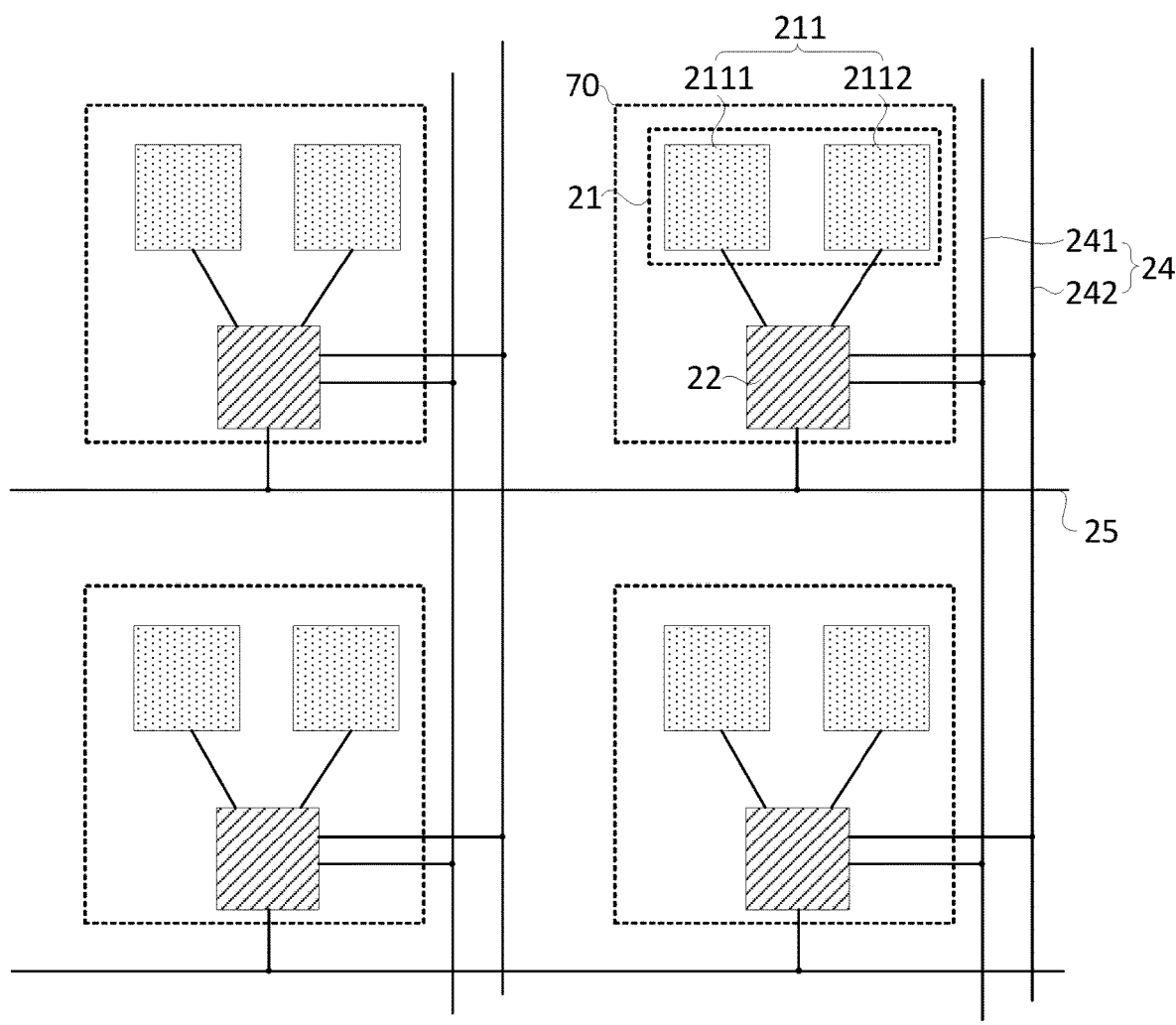
FIG. 25 illustrates a local structural schematic of a display panel according to various embodiments of the present disclosure.

FIG. 25 illustrates a local structural schematic of another display panel according to various embodiments of the present disclosure. As shown in FIG. 25, optionally, the display panel provided by the embodiments of the present disclosure may include a plurality of sub-pixels 70 arranged in an array; each sub-pixel 70 may include one LED unit 21 and one pulse-width modulation chip 22; each LED unit 21 may include a number N of LED sub-units 211; the number N of LED sub-units 211 in a same subpixel 70 may be electrically connected to the pulse-width modulation chip 22 of the subpixel 70 respectively, where N is a positive integer greater than 1.

For example, each sub-pixel 70 may include the number N of LED sub-units 211, and the number N of LED sub-units 211 may be electrically connected to a pulse-width modulation chip 22 respectively, such that the pulse-width modulation chip 22 may control the display grayscales of the number N of LED sub-units 211 respectively, and the display grayscales of the number N of LED sub-units 211 may be different, thereby implementing higher grayscale resolution. Exemplarily, as shown in FIG. 25, taking the sub-pixel 70 including two LED sub-units 211 as an example, the pulse-width modulation chip 22 may control the two LED sub-units 211 to display different display grayscales respectively, and the combination of the two LED sub-units 211 may double the number of grayscales. Assuming that the number of grayscales that can be achieved by each LED unit 21 is 8 bits, and the number of grayscales of the combination of the two LED sub-units 211 may reach 9 bits; similarly, the number of grayscales may reach 10 bits by using three LED sub-units 211 for the sub-pixel 70, thereby meeting high-dynamic range (HDR) requirement.

The number of LED sub-units 211 in the sub-pixel 70 may be arbitrarily set according to actual needs. The more the number of LED sub-units 211 in the sub-pixel 70 is, the more it can help achieve higher grayscale resolution, which may not be limited according to the embodiments of the present disclosure.

Referring to FIG. 25, optionally, the display panel provided by the embodiments of the present disclosure may further include a plurality of data lines 24 and a plurality of scan lines 25. The pulse-width modulation chip 22 of each sub-pixel 70 may be electrically connected to a number N of data lines 24. The pulse-width modulation chips 22 of the sub-pixels 70 in a same row may be electrically connected to a same scan line 25, and the pulse-width modulation chips 22 of the sub-pixels 70 in different rows may be connected to different scan lines 25.

Exemplarily, as shown in FIG. 25, taking each sub-pixel 70 including two LED sub-units 211 as an example, the two LED sub-units 211 may be a first LED sub-unit 2111 and a second LED sub-unit 2112, respectively. The pulse-width modulation chip 22 of each sub-pixel 70 may be electrically connected to two data lines 24, where the two data lines 24 may be a first data line 241 and a second data line 242, respectively. The pulse-width modulation chips 22 of the sub-pixels 70 in a same row may be electrically connected to a same scan line 25. The pulse-width modulation chips 22 of the sub-pixels 70 in the same row may be activated simultaneously when receiving the valid scan pulse and may adjust the pulse-widths of the pulse signals outputted to the first LED sub-units 2111 and the second LED sub-units 2112 that are electrically connected to the pulse-width modulation chips 22 according to the data signals obtained from the first data line 241 and the second data line 242, respectively. In such way, the display grayscales of the first LED sub-units 2111 and the second LED sub-units 2112 may be controlled, simultaneously. The pulse-width modulation chips 22 of the sub-pixels 70 in a same row may adjust the pulse-widths of the pulse signals outputted to the first LED sub-units 2111 electrically connected to the pulse-width modulation chips 22 according to the data signals obtained from the first data line 241, thereby controlling the display grayscales of the first LED sub-units 2111. The pulse-width modulation chips 22 of the sub-pixels 70 in a same row may adjust the pulse-widths of the pulse signals outputted to the second LED sub-units 2112 electrically connected to the pulse-width modulation chips 22 according to the data signals obtained from the second data line 241, thereby controlling the display grayscales of the second LED sub-units 2112. The data signals provided by the first data line 241 and the second data line 242 may be different, such that the display grayscales of the first LED sub-units 2111 and the second LED sub-units 2112 may also be different. The combination of the first LED sub-units 2111 and the second LED sub-units 2112 may double the number of grayscales, thereby achieving higher grayscale resolution.

Figure 26:
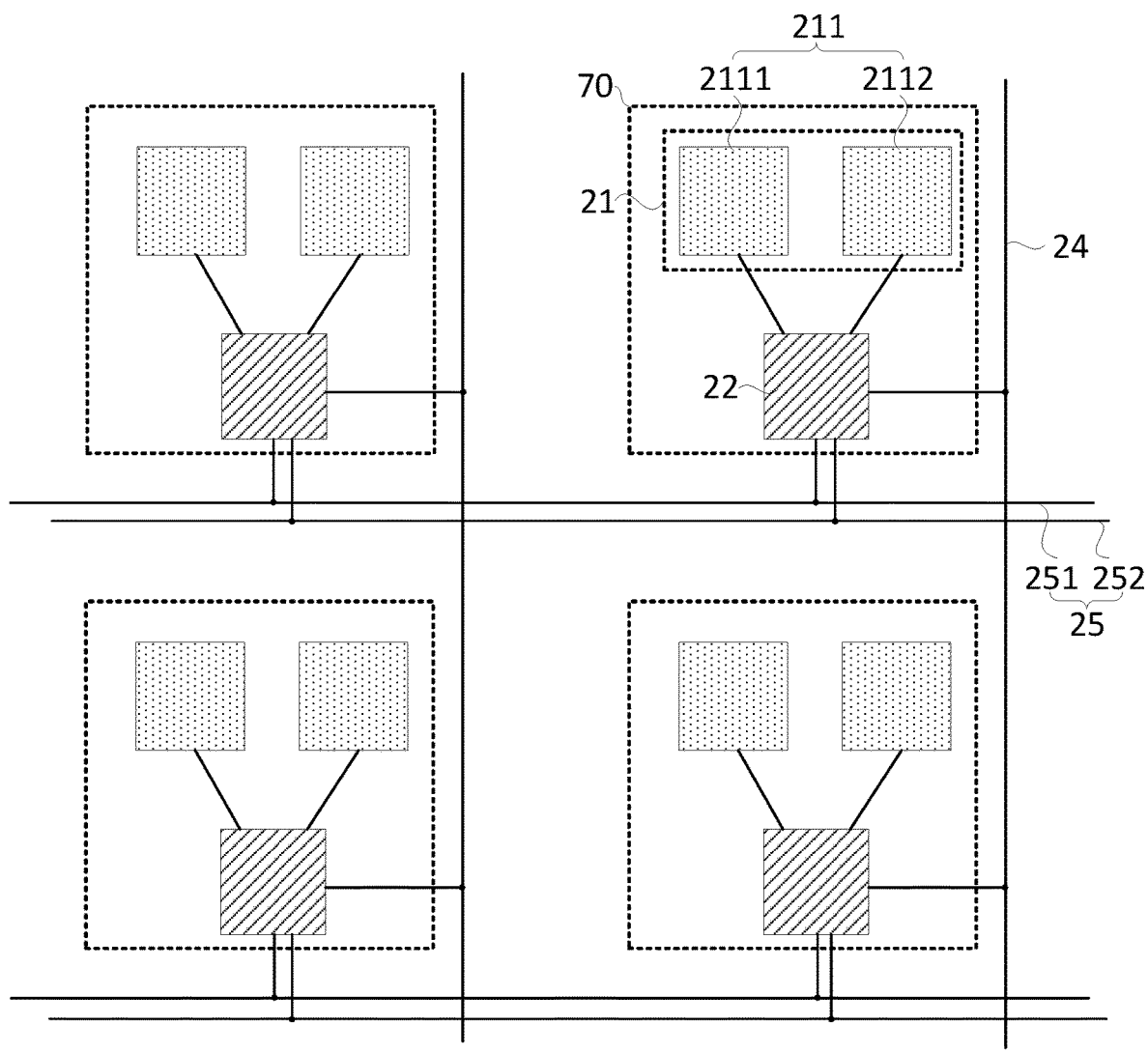
FIG. 26 illustrates a local structural schematic of another display panel according to various embodiments of the present disclosure.

FIG. 26 illustrates a local structural schematic of another display panel according to various embodiments of the present disclosure. As shown in FIG. 26, the display panel provided by the embodiments of the present disclosure may further include the plurality of data lines 24 and the plurality of scan lines 25. The pulse-width modulation chips 22 of sub-pixels 70 at a same column may be electrically connected to a same data line 24; the pulse-width modulation chips 22 of the sub-pixels 70 at different columns may be connected to different data lines 24; and the pulse-width modulation chip 22 of each sub-pixel 70 may be electrically connected to a number N of scan lines 25.

Exemplarily, as shown in FIG. 26, taking each sub-pixel 70 including two LED sub-units 211 as an example, the two LED sub-units 211 may be the first LED sub-unit 2111 and the second LED sub-unit 2112, respectively. The pulse-width modulation chip 22 of each sub-pixel 70 may be electrically connected to two scan lines 25, where the two scan lines 25 may be a first scan line 251 and a second scan line 252, respectively. The pulse-width modulation chips 22 of the sub-pixels 70 in a same column may be electrically connected to a same data line 24. The pulse-width modulation chips 22 of the sub-pixels 70 may be activated when receiving the valid scan pulses from the first scan lines 251 and may adjust the pulse-widths of the pulse signals outputted to the first LED sub-units 2111 that are electrically connected to the pulse-width modulation chips 22 according to the data signals obtained from the data lines 24, thereby controlling the display grayscales of the first LED sub-units 2111. The pulse-width modulation chips 22 of the sub-pixels 70 may be activated when receiving the valid scan pulses from the second scan lines 252 and may adjust the pulse-widths of the pulse signals outputted to the second LED sub-units 2112 electrically connected to the pulse-width modulation chips 22 according to the data signals obtained from the data lines 24, thereby controlling the display grayscales of the second LED sub-units 2112. Therefore, the display grayscales of the first LED sub-units 2111 and the second LED sub-units 2112 may be time-sharing controlled. The data signals obtained from the data lines 24 may be different when the pulse-width modulation chip 22 of the sub-pixel 70 receives the effective scan pulse provided by the first scan line 251 and when the pulse-width modulation chip 22 of the sub-pixel 70 receives the effective scan pulse provided by the second scan line 252. Therefore, the display grayscales of the first LED sub-units 2111 and the second LED sub-units 2112 may be different, and the combination of the first LED sub-units 2111 and the second LED sub-units 2112 may double the number of grayscales, thereby achieving higher grayscale resolution.

Figure 27:
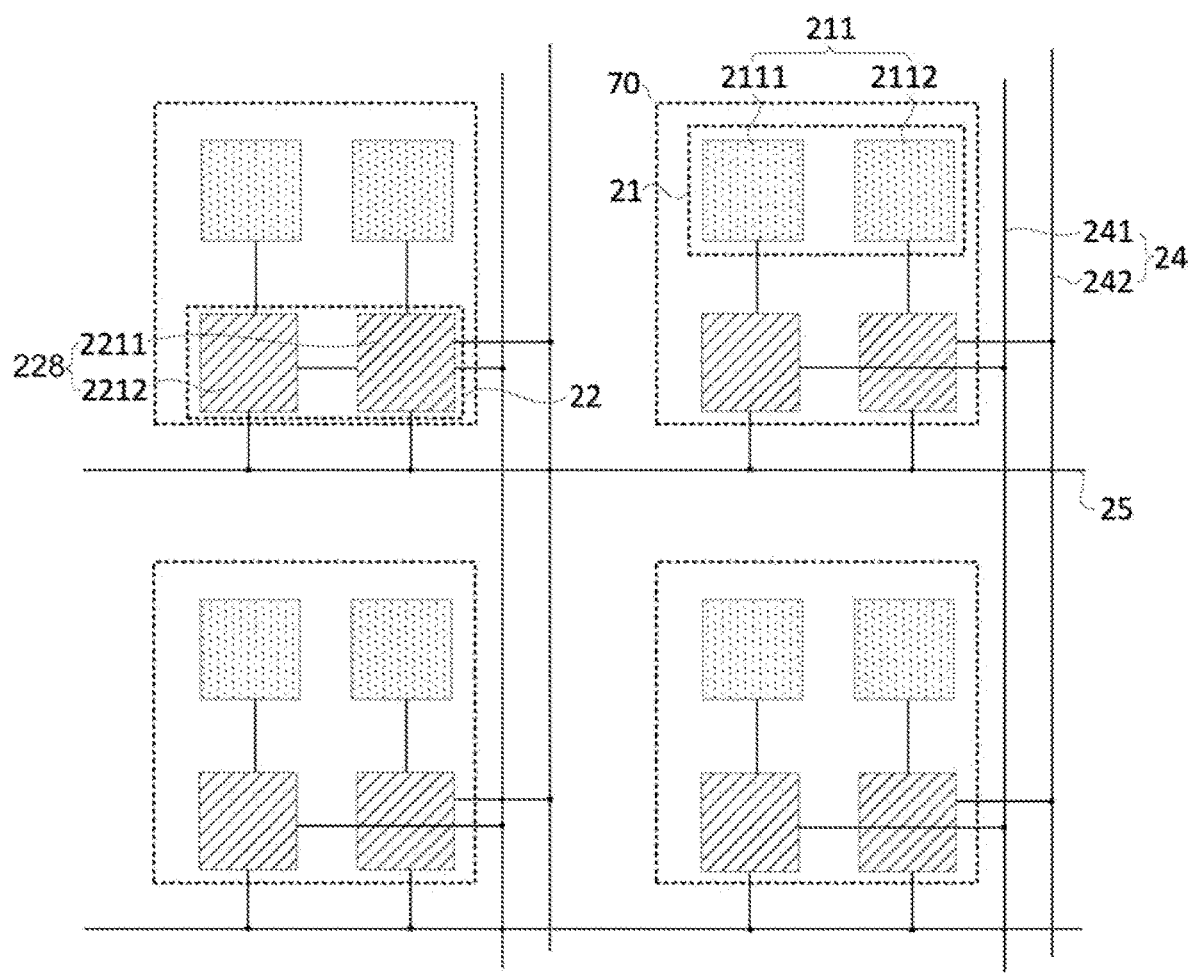
FIG. 27 illustrates a local structural schematic of another display panel according to various embodiments of the present disclosure.

FIG. 27 illustrates a local structural schematic of another display panel according to various embodiments of the present disclosure. As shown in FIG. 27, optionally, the display panel provided by the embodiments of the present disclosure may include the plurality of sub-pixels 70 arranged in an array; each sub-pixel 70 may include one LED unit 21 and one pulse-width modulation chip 22; each LED unit 21 may include the number N of LED sub-units 211; the pulse-width modulation chip 22 may include a number N of pulse-width modulation sub-chips 228; and the number N of LED sub-units 211 in a same sub-pixel 70 may be electrically connected to the number N of pulse-width modulation sub-chips 228 of the sub-pixel in a one-to-one correspondence, where N is a positive integer greater than 1.

For example, each sub-pixel 70 may include the number N of LED sub-units 211 and N pulse-width modulation sub-chips 228. The number N of LED sub-units 211 may be connected to the number N of pulse-width modulation sub-chips 228 in a one-to-one correspondence, such that the number N of pulse-width modulation sub-chips 228 may control the display grayscales of the number N of LED sub-units 211, thereby achieving higher grayscale resolution.

Exemplarily, as shown in FIG. 27, taking the sub-pixel 70 including two LED sub-units 211 and two pulse-width modulation sub-chips 228 as an example, the two LED sub-units 211 may include the first LED sub-unit 2111 and the second LED sub-unit 2112; and the two pulse-width modulation sub-chips 228 include a first pulse-width modulation sub-chip 2211 and a second pulse-width modulation sub-chip 2212. The first pulse-width modulation sub-chip 2211 may control the display grayscale of the first LED sub-unit 2111, and the second pulse-width modulation sub-chip 2212 may control the display grayscale of the second LED sub-unit 2112. The combination of the first LED sub-unit 2111 and the second LED sub-unit 2112 may double the number of grayscales, thereby achieving higher grayscale resolution.

Referring to FIG. 27, optionally, the display panel provided by the embodiments of the present disclosure may further include the plurality of data lines 24 and the plurality of scan lines 25. The number N of pulse-width modulation sub-chips 228 of each sub-pixel 70 may be electrically connected to the number N of data lines 24 in a one-to-one correspondence. The number N of pulse-width modulation sub-chips 228 of each sub-pixel 70 may be connected to a same scan line 25.

Exemplarily, as shown in FIG. 27, taking each sub-pixel 70 including two LED sub-units 211 and two pulse-width modulation sub-chips 228 as an example, the two LED sub-units 211 may respectively be the first LED sub-unit 2111 and the second LED sub-unit 2112; the two pulse-width modulation sub-chips 228 may respectively be the first pulse-width modulation sub-chip 2211 and the second pulse-width modulation sub-chip 2212; and the data line 24 may include the first data line 241 and the second data line 242. The first pulse-width modulation chip 2211 may be electrically connected to the first data line 241, and the second pulse-width modulation chip 2212 may be electrically connected to the second data line 242. The first pulse-width modulation chip 2211 and the second pulse-width modulation chip 2212 of each sub-pixel 70 may be electrically connected to a same scan line 25. The first pulse-width modulation sub-chip 2211 and the second pulse-width modulation sub-chip 2212 may be activated simultaneously when receiving the valid scan pulse. The first pulse-width modulation sub-chip 2211 may adjust the pulse-width of the pulse signal outputted to the first LED sub-unit 2111 electrically connected to the first pulse-width modulation sub-chip 2211 according to the data signal obtained from the first data line 241, thereby controlling the display grayscale of the first LED sub-unit 2111. The second pulse-width modulation sub-chip 2212 may adjust the pulse-width of the pulse signal outputted to the second LED sub-unit 2112 electrically connected to the second pulse-width modulation sub-chip 2212 according to the data signal obtained from the second data line 242, thereby controlling the display grayscale of the second LED sub-unit 2112. The data signals provided by the first data line 241 and the second data line 242 may be different. Therefore, the display grayscales of the first LED sub-unit 2111 and the second LED sub-unit 2112 may also be different. The combination of the first LED sub-unit 2111 and the second LED sub-unit 2112 may double the number of grayscales, thereby achieving higher grayscale resolution.

Figure 28:
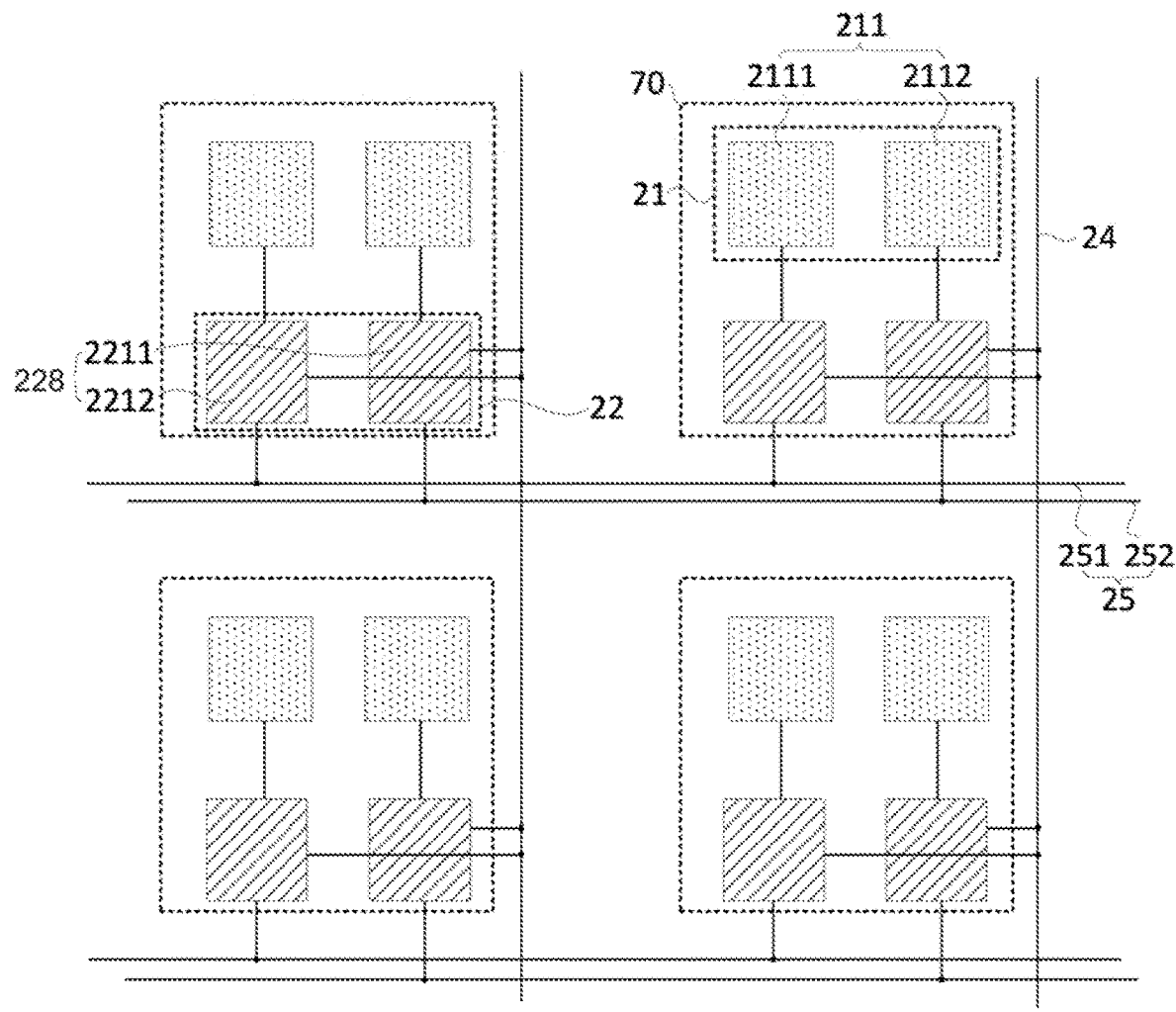
FIG. 28 illustrates a local structural schematic of another display panel according to various embodiments of the present disclosure.

FIG. 28 illustrates a local structural schematic of another display panel according to various embodiments of the present disclosure. As shown in FIG. 28, optionally, the display panel provided by the embodiments of the present disclosure may further include the plurality of data lines 24 and the plurality of scan lines 25. The number N of pulse-width modulation sub-chips 228 of each sub-pixel 70 may be electrically connected to the number N of scan lines 25 in a one-to-one correspondence. The number N of pulse-width modulation sub-chips 228 of each sub-pixel 70 may be connected to a same data line 24.

Exemplarily, as shown in FIG. 28, taking each sub-pixel 70 including two LED sub-units 211 and two pulse-width modulation sub-chips 228 as an example, the two LED sub-units 211 may respectively be the first LED sub-unit 2111 and the second LED sub-unit 2112; the two pulse-width modulation sub-chips 228 may respectively be the first pulse-width modulation sub-chip 2211 and the second pulse-width modulation sub-chip 2212; and the pulse-width modulation chips 22 of each sub-pixel 70 may be electrically connected to two scan lines 25 which are the first scan line 251 and the second scan line 252, respectively. The pulse-width modulation chips 221 of the sub-pixels 70 in a same column may be electrically connected to a same data line 24. When the first pulse-width modulation sub-chip 2211 is activated after receiving the effective scan pulse provided by the first scan line 251, the first pulse-width modulation sub-chip 2211 may adjust the pulse-width of the pulse signal outputted to the first LED sub-unit 2111 electrically connected to the first pulse-width modulation sub-chip 2211 according to the data signal from the data line 24, thereby controlling the display grayscale of the first LED sub-unit 2111. When the second pulse-width modulation sub-chip 2212 is activated after receiving the effective scan pulse provided by the second scan line 252, the second pulse-width modulation sub-chip 2212 may adjust the pulse-width of the pulse signal outputted to the second LED sub-unit 2112 electrically connected to the second pulse-width modulation sub-chip 2212 according to the data signal from the data line 24, thereby controlling the display grayscale of the second LED sub-unit 2112. Therefore, the display grayscales of the first LED sub-unit 2111 and the second LED sub-unit 2112 may be time-sharing controlled. The data signals obtained from the data line 24 may be different when the first pulse-width modulation chip 2211 receives the effective scan pulse provided by the first scan line 251 and when the second pulse-width modulation chip 22 receives the effective scan pulse provided by the second scan line 252. Therefore, the display grayscales of the first LED sub-unit 2111 and the second LED sub-unit 2112 may be different, and the combination of the first LED sub-unit 2111 and the second LED sub-unit 2112 may double the number of grayscales, thereby achieving higher grayscale resolution.

Figure 29:
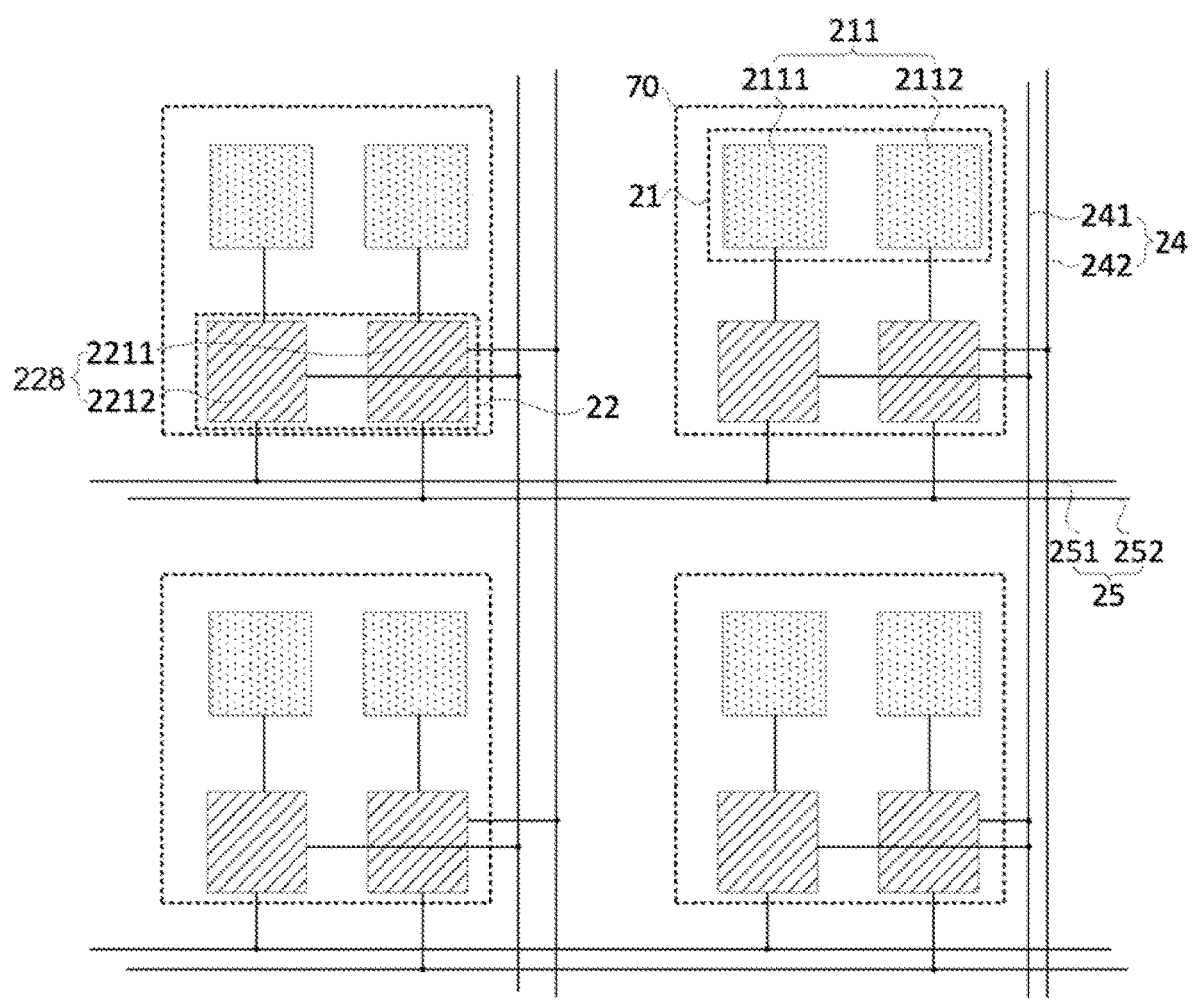
FIG. 29 illustrates a local structural schematic of another display panel according to various embodiments of the present disclosure.

FIG. 29 illustrates a local structural schematic of another display panel according to various embodiments of the present disclosure. As shown in FIG. 29, the display panel provided by the embodiments of the present disclosure may further include the plurality of data lines 24 and the plurality of scan lines 25. The number N of pulse-width modulation sub-chips 228 of each sub-pixel 70 may be electrically connected to the number N of data lines 24 in a one-to-one correspondence; and the number N of pulse-width modulation sub-chips 228 of each sub-pixel 70 may be electrically connected to the number N of scan lines 25 in a one-to-one correspondence.

Exemplarily, as shown in FIG. 29, taking each sub-pixel 70 including two LED sub-units 211 and two pulse-width modulation sub-chips 228 as an example, the two LED sub-units 211 may respectively be the first LED sub-unit 2111 and the second LED sub-unit 2112; and the two pulse-width modulation sub-chips 228 may respectively be the first pulse-width modulation sub-chip 2211 and the second pulse-width modulation sub-chip 2212. The pulse-width modulation chips 22 of each sub-pixel 70 may be electrically connected to two scan lines 25 which are the first scan line 251 and the second scan line 252, respectively. The pulse-width modulation chips 22 of each sub-pixel 70 may be electrically connected to two data lines 24 which are the first data line 241 and the second data line 242, respectively. When the first pulse-width modulation sub-chip 2211 is activated after receiving the effective scan pulse provided by the first scan line 251, the first pulse-width modulation sub-chip 2211 may adjust the pulse-width of the pulse signal outputted to the first LED sub-unit 2111 electrically connected to the first pulse-width modulation sub-chip 2211 according to the data signal from the first data line 241, thereby controlling the display grayscale of the first LED sub-unit 2111. When the second pulse-width modulation sub-chip 2212 is activated after receiving the effective scan pulse provided by the second scan line 252, the second pulse-width modulation sub-chip 2212 may adjust the pulse-width of the pulse signal outputted to the second LED sub-unit 2112 electrically connected to the second pulse-width modulation sub-chip 2212 according to the data signal from the second data line 242, thereby controlling the display grayscale of the second LED sub-unit 2112. The data signals obtained from the first data line 241 and the second data line 242 may be different. Therefore, the display grayscales of the first LED sub-unit 2111 and the second LED sub-unit 2112 may be different, and the combination of the first LED sub-unit 2111 and the second LED sub-unit 2112 may double the number of grayscales, thereby achieving higher grayscale resolution.

Figure 30:
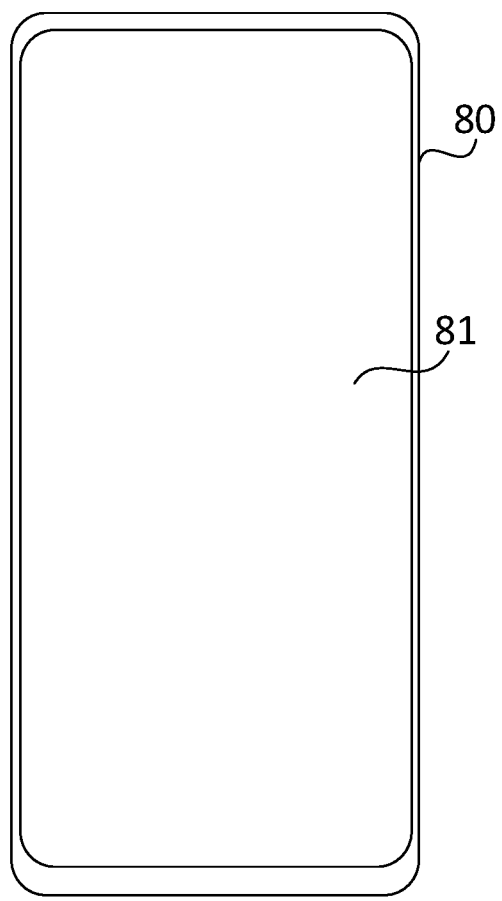
FIG. 30 illustrates a structural schematic of a display device according to various embodiments of the present disclosure.

Based on the same inventive concept, the embodiments of the present disclosure also provide a display device. FIG. 30 illustrates a structural schematic of the display device according to various embodiments of the present disclosure. As shown in FIG. 30, a display device 80 may include the display panel 81 according to any embodiments of the present disclosure. Therefore, the display device 80 provided by the embodiments of the present disclosure may have the technical effect of the technical solution provided in any of the above-mentioned embodiments of the present disclosure; and the structures, which are same as or correspond to the above-mentioned embodiments, and the term explanation may not be described in detail herein. The display device 80 provided by the embodiments of the present disclosure may be a mobile phone as shown in FIG. 30, and may also be any electronic product with display function, which may include, but may not limited to, the following categories: TVs, laptops, desktop displays, tablet computers, digital cameras, smart bracelets, smart glasses, car monitors, medical equipment, industrial control equipment, touch interactive terminal, and the like, which may not be limited according to the embodiments of the present disclosure.

Figure 31:
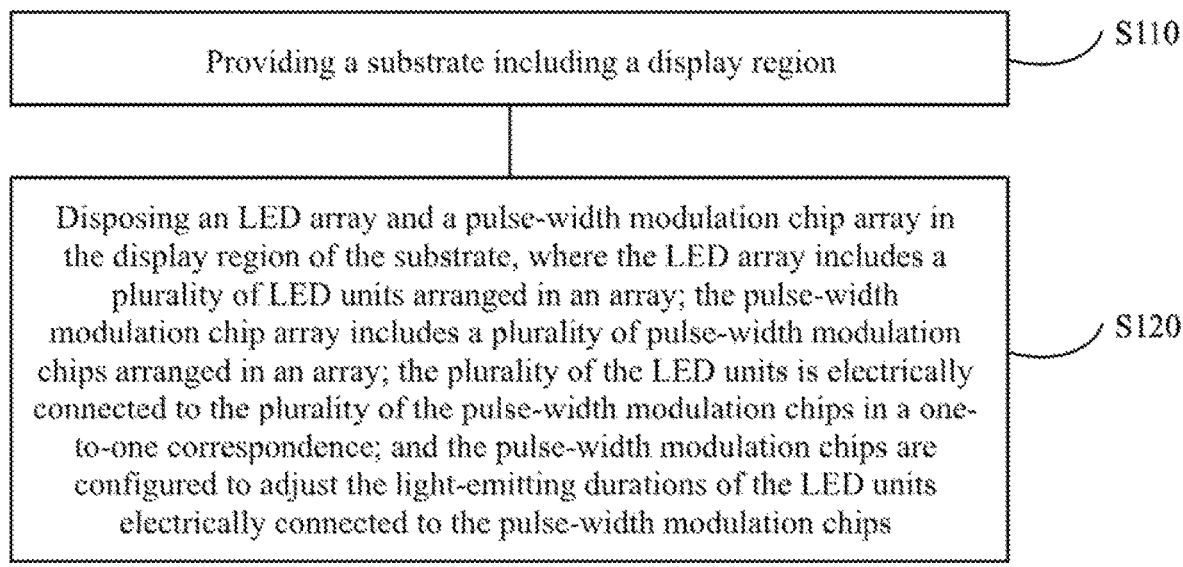
FIG. 31 illustrates a flowchart of a method for fabricating a display panel according to various embodiments of the present disclosure.

Based on the same inventive concept, the embodiments of the present disclosure also provide a method for fabricating a display panel, which is configured to form any display panel provided in the above-mentioned embodiments of the present disclosure. The structures, which are same as or correspond to the above-mentioned embodiments, and the term explanation may not be described in detail herein. FIG. 31 illustrates a flowchart of a method for fabricating a display panel according to various embodiments of the present disclosure. As shown in FIG. 31, the method may include the following steps:

step S110, providing a substrate including a display region, where the substrate may be a rigid substrate or a flexible substrate, which may be set by those skilled in the art according to actual needs, and may not be limited according to the embodiments of the present disclosure; and step S120, disposing an LED array and a pulse-width modulation chip array in the display region of the substrate, where the LED array may include a plurality of LED units arranged in an array; the pulse-width modulation chip array may include a plurality of pulse-width modulation chips arranged in an array; the plurality of the LED units may be electrically connected to the plurality of the pulse-width modulation chips in a one-to-one correspondence; and the pulse-width modulation chips may be configured to adjust the light-emitting durations of the LED units electrically connected to the pulse-width modulation chips.

For example, each LED unit may be connected to a pulse-width modulation chip correspondingly, and the pulse-width modulation chip may be configured to adjust the light-emitting duration of the LED unit electrically connected to the pulse-width modulation chip. Furthermore, the display grayscale of the LED unit may be controlled by adjusting the light-emitting duration of the LED unit. The LED unit and the pulse-width modulation chip may be disposed at a same side or different sides of the substrate, which may be set by those skilled in the art according to actual needs.

The pulse-width modulation chips 22, which are located in the display region 201, may be arranged in one-to-one correspondence with the LED units 21. The distance between the pulse-width modulation chip 22 and the LED unit 21 electrically connected to the pulse-width modulation chip 22 may be relatively close, which may reduce the signal delay; moreover, the distances between different pulse-width modulation chips 22 and the corresponding LED units 21 may be same or equivalent, which may reduce the signal differences of the LED units 21 at different positions, thereby being beneficial for improving the brightness uniformity of the display panel.

Optionally, disposing the LED array and the pulse-width modulation chip array in the display region of the substrate may include:

fabricating the LED array by a wafer-level process and transfer-printing the LED array to the first side of the substrate; and fabricating the pulse-width modulation chip array by a wafer-level process and transfer-printing to the second side of the substrate, where the first side and the second side are opposite to each other.

Compared with preparing the LED array directly on the substrate, the LED array may be generated on the wafer to fabricate smaller LED units by the wafer-level process, which is beneficial for improving the resolution of the display panel. When the display panel is applied to the transparent display field, the space occupied by the LED units may be smaller, which may increase the transmittance of the display panel and improve the transparent display effect. Similarly, the pulse-width modulation chip array may be generated on the wafer to fabricate smaller pulse-width modulation chips through the wafer-level process, which is beneficial for improving the resolution of the display panel. When the display panel is applied to the transparent display field, the transmittance of the display panel may be increased, and the effect of transparent display may be improved, which may not be described in detail herein.

After fabricating the LED array and the pulse-width modulation chip array using the wafer-level process, the LED array may be transfer-printed to the first side of the substrate, and the pulse-width modulation chip array may be transfer-printed to the second side of the substrate. When the display panel is applied to the transparent display, compared with that the LED array and the pulse-width modulation chip array are disposed at a same side of the substrate, the LED array and the pulse-width modulation chip array may be disposed at different sides of the substrate, which is beneficial for reducing the area of the substrate shielded by the LED array and the pulse-width modulation chip array and increasing the transmittance of the display panel to implement transparent display.

Optionally, disposing the LED array and the pulse-width modulation chip array in the display region of the substrate may include:

bonding the plurality of LED units of the LED array to the first side of the substrate by eutectic bonding; and bonding the plurality of pulse-width modulation chips of the pulse-width modulation chip array to the second side of the substrate by eutectic bonding.

Figure 32:
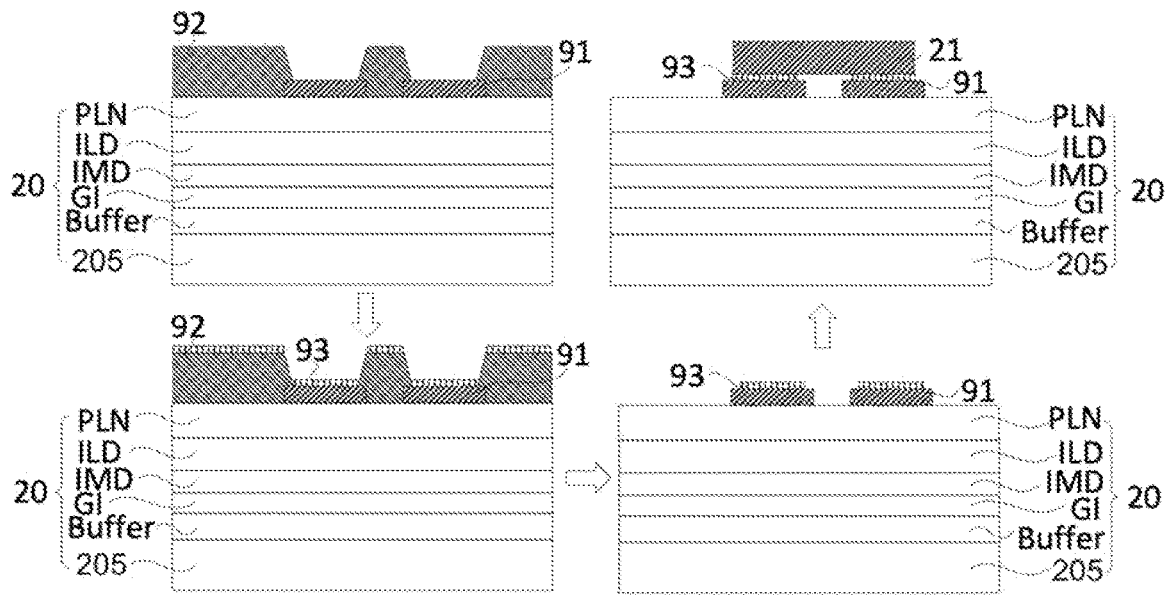
FIG. 32 illustrates a flowchart of a method for fabricating another display panel according to various embodiments of the present disclosure.

Exemplarily, FIG. 32 illustrates a flowchart of a method for fabricating another display panel according to various embodiments of the present disclosure. As shown in FIG. 32, taking the constant current switch unit (not shown in the FIG. 32) located at the side of the base substrate 205 away from the pulse-width modulation chip (not shown FIG. 32) as an example, after fabricating the constant current switch unit at the side of the base substrate 205, the substrate 20 may be formed. The substrate 20 may include a lead electrode 91, which is configured to electrically connect the LED unit with the pulse-width modulation chip or other drive circuit, where the lead electrode 91 may be ITO or other conductive materials, which may not be limited according to the embodiments of the present disclosure.

A negative photoresist layer 92 may be coated on the substrate 20, and the negative photoresist layer 92 may be photoetched through a photolithography process to expose the lead electrode 91; then a eutectic layer 93 may be deposited, the negative photoresist layer 92 may be removed by NPR (negative photoresist) removing technology. Therefore, the eutectic layer 93 may be prepared at the side of the lead electrode 91 away from the substrate 20. The LED unit 21 may be bonded to the eutectic layer 93 by using a eutectic soldering device, such that the electrical connection between the LED unit 21 and the substrate 20 may be implemented by eutectic bonding. Similarly, the plurality of pulse-width modulation chips (not shown in FIG. 32) of the pulse-width modulation chip array may be bonded to the second side of the substrate 20 by eutectic bonding, thereby completing the fabrication of the display panel.

For the fabrication method of the display panel provided by the embodiments of the present disclosure, LED arrays and pulse-width modulation chip arrays may be fabricated using the wafer-level technology, such that smaller LED units and pulse-width modulation chips may be fabricated, which is beneficial for improving the resolution of the display panel. When the display panel is applied to the transparent display field, the space occupied by the LED units and the pulse-width modulation chips may be smaller, which may increase the transmittance of the display panel and improve the transparent display effect. Meanwhile, compared with that the LED array and the pulse-width modulation chip array are disposed at a same side of the substrate, the LED array and the pulse-width modulation chip array may be transfer-printed at different sides of the substrate, which is beneficial for reducing the area of the substrate shielded by the LED array and the pulse-width modulation chip array and increasing the transmittance of the display panel to implement transparent display.

From the above-mentioned embodiments, it can be seen that the display panel and its fabrication method, and the display device provided by the present disclosure may achieve at least the following beneficial effects:

For the display panel provided by the embodiments of the present disclosure, the plurality of pulse-width modulation chips may be configured to be electrically connected to the plurality of LED units in the one-to-one correspondence at the display region, and the plurality of pulse-width modulation chips may be configured to adjust the light-emitting durations of the LED units electrically connected to the plurality of pulse-width modulation chips, thereby controlling the display grayscales of the LED units. In such way, the distance between the pulse-width modulation chip and the LED unit electrically connected to the pulse-width modulation chip may be relative short to reduce signal delay; moreover, the distances between different pulse-width modulation chips and the corresponding LED units may be same or equivalent, thereby reducing the signal differences of the LED units at different positions and improving the brightness uniformity of the display panel.

It should be noted that the above may only be the preferred embodiments of the present disclosure and the applied technical principles. Those skilled in the art should understand that the present disclosure is not limited to the embodiments described herein. For those skilled in the art, various obvious changes, readjustments and substitutions may be made without departing from the protection scope of the present disclosure. Therefore, although the present disclosure has been described in more detail through the above-mentioned embodiments, the present disclosure may not be limited to the above-mentioned embodiments. Without departing from the concept of the present disclosure, more other equivalent embodiments may be included, and the scope of the present invention may be determined by the scope of the appended claims.

What is claimed is:

1. A display panel, comprising:
    a substrate, including a display region;
    a light-emitting diode (LED) array at the display region, wherein the LED array includes a plurality of LED units arranged in an array; and
    a pulse-width modulation chip array at the display region, wherein the pulse-width modulation chip array includes a plurality of pulse-width modulation chips arranged in an array; wherein:
    the plurality of LED units is electrically connected to the plurality of pulse-width modulation chips in a one-to-one correspondence;
    a pulse-width modulation chip of the plurality of pulse-width modulation chips is configured to adjust a light-emitting duration of a corresponding LED unit electrically connected thereto; and
    the display panel further includes a drive chip, a plurality of data lines, and a plurality of scan lines, wherein:
        the drive chip is configured to provide scan signals to the plurality of pulse-width modulation chips through the plurality of scan lines, and to provide data signals to the plurality of pulse-width modulation chips through the plurality of data lines;
        the substrate is made of a transparent material and includes a first side and a second side which are opposite to each other:
        the LED array is at the first side, and the pulse-width modulation chip array is at the second side; and
        along a direction perpendicular to the substrate, the plurality of LED units and the plurality of pulse-width modulation chips are electrically connected in the one-to-one correspondence and overlapped with each other.

2. The display panel according to claim 1, wherein:
current values of drive currents of the plurality of LED units are all same.

3. The display panel according to claim 1, wherein:
the substrate further includes a non-display region; and
the drive chip is disposed at the non-display region.

4. The display panel according to claim 1, wherein:
a plurality of data lines and a plurality of scan lines, which are insulated from each other, are disposed at the first side of the substrate; a plurality of first via holes, a plurality of second via holes, and a plurality of third via holes are disposed at the substrate; the plurality of scan lines is electrically connected to the plurality of pulse-width modulation chips through the plurality of first via holes; the plurality of data lines is electrically connected to the plurality of pulse-width modulation chips through the plurality of second via holes; and the plurality of pulse-width modulation chips is electrically connected to the plurality of LED units through the plurality of third via holes; or
a plurality of data lines and a plurality of scan lines are disposed at the second side of the substrate; the plurality of data lines and the plurality of scan lines are electrically connected to the plurality of pulse-width modulation chips at the second side; a plurality of third via holes is disposed at the substrate; and the plurality of pulse-width modulation chips is electrically connected to the plurality of LED units through the plurality of third via holes.

5. The display panel according to claim 1, wherein:
the pulse-width modulation chip includes a data signal terminal, a scan signal terminal, a constant current power input terminal, and an output terminal;
the output terminal of the pulse-width modulation chip is electrically connected to an LED unit; and
the pulse-width modulation chip is configured to be activated when a valid scan pulse is inputted via the scan signal terminal and to adjust a light-emitting duration of the LED unit electrically connected thereto according to a data signal inputted via the data signal terminal.

6. The display panel according to claim 5, wherein:
the pulse-width modulation chip includes a pulse-width modulation unit, a constant current unit and a switch unit;
the pulse-width modulation unit includes the data signal terminal and the scan signal terminal; the constant current unit includes the constant current power input terminal; and an output terminal of the constant current unit is electrically connected to a first terminal of the switch unit; and the constant current unit is configured to input a constant drive current to the switch unit; and
a control terminal of the switch unit is electrically connected to an output terminal of the pulse-width modulation unit; and a second terminal of the switch unit is the output terminal of the pulse-width modulation chip; the pulse-width modulation unit is configured to be activated when a valid scan pulse is inputted via the scan signal terminal and to adjust a pulse-width of an outputted pulse signal according to a data signal inputted via the data signal terminal; and the switch unit is configured to control a light-emitting duration of an LED unit according to the outputted pulse signal.

7. The display panel according to claim 1, wherein:
the substrate includes a base substrate and a plurality of constant current switch units at one side of the base substrate; the plurality of constant current switch units and the plurality of pulse-width modulation chips are in a one-to-one correspondence; and each of the plurality of constant current switch units includes a constant current unit and a switch unit;
the pulse-width modulation chip is electrically connected to an LED unit through a constant current switch unit; the pulse-width modulation chip includes a data signal terminal, a scan signal terminal, and an output terminal; the output terminal of the pulse-width modulation chip is electrically connected to a control terminal of the switch unit; a first terminal of the switch unit is electrically connected to an output terminal of the constant current unit; and the constant current unit includes a constant current power input terminal and is configured to input a constant drive current to the switch unit;
a second terminal of the switch unit is electrically connected to the LED unit; and
the pulse-width modulation chip is configured to be activated when a valid scan pulse is inputted via the scan signal terminal and to adjust a pulse-width of a pulse signal outputted to the switch unit electrically connected to the pulse-width modulation chip according to a data signal inputted via the data signal terminal, wherein the switch unit controls a light-emitting duration of the LED unit according to the pulse signal.

8. The display panel according to claim 7, wherein:
the switch unit includes a switch transistor; a first terminal of the switch transistor is electrically connected to the output terminal of the constant current unit; and a second terminal of the switch transistor is electrically connected to the LED unit.

9. The display panel according to claim 6, wherein:
the pulse-width modulation chip includes a register and a state machine;
the register is electrically connected to the data signal terminal, and the state machine is electrically connected to the scan signal terminal, the register, and the switch unit, respectively;
the state machine is configured to control the state machine to start or shut down according to a scan signal inputted via the scan signal terminal; and the register is configured to store a data signal inputted via the data signal terminal; and
the state machine is also configured to adjust a pulse-width of an outputted pulse signal according to the scan signal inputted via the scan signal terminal and a data signal read from the register.

10. The display panel according to claim 5, wherein:
a plurality of positive power signal lines is further disposed on the substrate; a positive power signal line is electrically connected to the constant current power input terminal; and the positive power signal line and the pulse-width modulation chip are at a same side of the substrate; or
a plurality of positive power signal lines is further disposed on the substrate; the substrate further includes a plurality of fourth via holes; a positive power signal line and the pulse-width modulation chip are at different sides of the substrate; and the positive power signal line is electrically connected to the constant current power input terminal through a fourth via hole.

11. The display panel according to claim 7, wherein:
a plurality of positive power signal lines is further disposed on the substrate; and a positive power signal line and the constant current switch unit are at a same side of the base substrate; or
a plurality of positive power signal lines is further disposed on the substrate; the substrate further includes a plurality of fifth via holes; a positive power signal line and the constant current switch unit are at different sides of the base substrate; and the positive power signal line is electrically connected to the constant current power input terminal through a fifth via hole.

12. The display panel according to claim 1, wherein:
a plurality of negative power signal lines is disposed on the substrate, and each of the plurality of LED units is electrically connected to a negative power signal line.

13. The display panel according to claim 12, wherein:
the plurality of negative power signal lines and the plurality of LED units are at a same side of the substrate; or
the plurality of negative power signal lines and the plurality of LED units are at different sides of the substrate; the substrate includes a plurality of sixth via holes; and the plurality of negative power signal lines is electrically connected to the plurality of LED units through the plurality of sixth via holes.

14. The display panel according to claim 1, further including:
a plurality of sub-pixels arranged in an array, wherein each sub-pixel includes an LED unit and a pulse-width modulation chip; each LED unit includes a number N of LED sub-units; and all of the number N of LED sub-units in a same subpixel are electrically connected to the pulse-width modulation chip of the same sub-pixel, respectively, wherein N is a positive integer greater than 1.

15. The display panel according to claim 14, further including:
a plurality of data lines and a plurality of scan lines, wherein the pulse-width modulation chip of each sub-pixel is electrically connected to a number N of data lines; pulse-width modulation chips of sub-pixels in a same row are electrically connected to a same scan line; and pulse-width modulation chips of sub-pixels in different rows are electrically connected to different scan lines; or a plurality of data lines and a plurality of scan lines, wherein pulse-width modulation chips of sub-pixels at a same column are electrically connected to a same data line; pulse-width modulation chips of sub-pixels at different columns are connected to different data lines; and the pulse-width modulation chip of each sub-pixel is electrically connected to a number N of scan lines.

16. The display panel according to claim 1, further including:
a plurality of sub-pixels arranged in an array, wherein each sub-pixel includes an LED unit and a pulse-width modulation chip; each LED unit includes a number N of LED sub-units; each pulse-width modulation chip includes a number N of pulse-width modulation sub-chips; and all of the number N of LED sub-units in a same sub-pixel are electrically connected to all of the number N of pulse-width modulation sub-chips of the same sub-pixel in a one-to-one correspondence, wherein N is a positive integer greater than 1.

17. The display panel according to claim 16, further including:
a plurality of data lines and a plurality of scan lines, wherein all of the number N of pulse-width modulation sub-chips of each sub-pixel are electrically connected to a number N of data lines in a one-to-one correspondence; and all of the number N of pulse-width modulation sub-chips of each sub-pixel are connected to a same scan line; or
a plurality of data lines and a plurality of scan lines, wherein all of the number N of pulse-width modulation sub-chips of each sub-pixel are electrically connected to a number N of scan lines in a one-to-one correspondence; and all of the number N of pulse-width modulation sub-chips of each sub-pixel are connected to a same data line; or
a plurality of data lines and a plurality of scan lines, wherein all of the number N of pulse-width modulation sub-chips of each sub-pixel are electrically connected to a number N of data lines in a one-to-one correspondence; and all of the number N of pulse-width modulation sub-chips of each sub-pixel are electrically connected to a number N of scan lines in a one-to-one correspondence.

18. A display device, comprising:
a display panel, comprising:
a substrate, including a display region;
a light-emitting diode (LED) array at the display region, wherein the LED array includes a plurality of LED units arranged in an array; and
a pulse-width modulation chip array at the display region, wherein the pulse-width modulation chip array includes a plurality of pulse-width modulation chips arranged in an array; wherein:
the plurality of LED units is electrically connected to the plurality of pulse-width modulation chips in a one-to-one correspondence;
a pulse-width modulation chip of the plurality of pulse-width modulation chips is configured to adjust a light-emitting duration of a corresponding LED unit electrically connected thereto; and
the display panel further includes a drive chip, a plurality of data lines, and a plurality of scan lines, wherein:
the drive chip is configured to provide scan signals to the plurality of pulse-width modulation chips through the plurality of scan lines, and to provide data signals to the plurality of pulse-width modulation chips through the plurality of data lines;
the substrate is made of a transparent material and includes a first side and a second side which are opposite to each other:
the LED array is at the first side, and the pulse-width modulation chip array is at the second side; and
along a direction perpendicular to the substrate, the plurality of LED units and the plurality of pulse-width modulation chips are electrically connected in the one-to-one correspondence and overlapped with each other.

19. A method for fabricating a display panel, comprising:
providing a substrate which includes a display region; and
disposing an LED array and a pulse-width modulation chip array at the display region of the substrate, by performing:
fabricating the LED array by a wafer-level process and transfer-printing the LED array to a first side of the substrate; and
fabricating the pulse-width modulation chip array by a wafer-level process and transfer-printing to a second side of the substrate, wherein the first side and the second side are opposite to each other;
wherein the LED array includes a plurality of LED units arranged in an array; the pulse-width modulation chip array includes a plurality of pulse-width modulation chips arranged in an array; the plurality of the LED units is electrically connected to the plurality of the pulse-width modulation chips in a one-to-one correspondence; and the plurality of pulse-width modulation chips is configured to adjust light-emitting durations of the plurality of LED units electrically connected to the plurality of pulse-width modulation chips;
the display panel further includes a drive chip, a plurality of data lines, and a plurality of scan lines, wherein:
the drive chip is configured to provide scan signals to the plurality of pulse-width modulation chips through the plurality of scan lines, and to provide data signals to the plurality of pulse-width modulation chips through the plurality of data lines;
the substrate is made of a transparent material and includes a first side and a second side which are opposite to each other:
the LED array is at the first side, and the pulse-width modulation chip array is at the second side; and
along a direction perpendicular to the substrate, the plurality of LED units and the plurality of pulse-width modulation chips are electrically connected in the one-to-one correspondence and overlapped with each other.

* * * * *